United States Patent
Coleman et al.

(12)

(10) Patent No.: US 9,718,267 B2
(45) Date of Patent: Aug. 1, 2017

(54) SCREEN PRINTING APPARATUS INCLUDING SUPPORT BARS, AND METHODS OF USING SAME

(71) Applicant: Photo Stencil, LLC, Colorado Spring, CO (US)

(72) Inventors: William E. Coleman, Colorado Springs, CO (US); Brad Keiser, Colorado Springs, CO (US)

(73) Assignee: PHOTO STENCIL, LLC, Colorado Springs, CO (US)

(*) Notice: Subject to any disclaimer, the term of this patent is extended or adjusted under 35 U.S.C. 154(b) by 0 days.

(21) Appl. No.: 14/377,739

(22) PCT Filed: Feb. 8, 2013

(86) PCT No.: PCT/US2013/025431
§ 371 (c)(1),
(2) Date: Aug. 8, 2014

(87) PCT Pub. No.: WO2013/120013
PCT Pub. Date: Aug. 15, 2013

(65) Prior Publication Data
US 2015/0352831 A1    Dec. 10, 2015

Related U.S. Application Data

(60) Provisional application No. 61/596,580, filed on Feb. 8, 2012, provisional application No. 61/694,537, filed on Aug. 29, 2012.

(51) Int. Cl.
*H01L 31/02*    (2006.01)
*B41F 15/34*    (2006.01)
(Continued)

(52) U.S. Cl.
CPC ............... *B41F 15/34* (2013.01); *B41C 1/14* (2013.01); *B41F 15/00* (2013.01); *B41N 1/24* (2013.01);
(Continued)

(58) Field of Classification Search
CPC ..................... H01L 31/022425; B41F 15/34
See application file for complete search history.

(56) References Cited

U.S. PATENT DOCUMENTS 5,359,928 A    11/1994 Blessington et al.

FOREIGN PATENT DOCUMENTS

EP    0850758 A2    7/1998
EP    0894157 B1    1/2000
(Continued)

OTHER PUBLICATIONS

JP2006-341547, machine translation, 2006.*
(Continued)

*Primary Examiner* — Robert Vetere
(74) *Attorney, Agent, or Firm* — Lathrop & Gage LLP

(57) ABSTRACT

A method is disclosed for electroforming metal screen. The method deposits photoresist over a mandrel, and then exposes the photoresist with light through a plurality of openings in a photo tool to form hardened resist pillars. Unexposed photoresist is removed without affecting the resist pillars. The method then electroforms the metal screen in areas free of the hardened resist pillars such that the metal screen forms apertures defined by each of the resist pillars, a space between at least two of the resist pillars defining a support bar that forms at a reduced thickness as compared to portions of the metal screen that are not between the resist pillars. Finally, the method detaches the metal screen from the mandrel.

11 Claims, 25 Drawing Sheets

(51) Int. Cl.
*B41F 15/00* (2006.01)
*C25D 1/10* (2006.01)
*B41C 1/14* (2006.01)
*B41N 1/24* (2006.01)
*H01L 31/0224* (2006.01)

(52) U.S. Cl.
CPC ........ *C25D 1/10* (2013.01); *H01L 31/022425* (2013.01); *Y02E 10/50* (2013.01)

(56) References Cited

FOREIGN PATENT DOCUMENTS

| | | | | |
|---|---|---|---|---|
| JP | 2006341547 A | * | 12/2006 | |
| NL | WO 9740213 A1 | * | 10/1997 | ............... C25D 1/08 |
| WO | 2009006230 A2 | | 1/2009 | |
| WO | WO 2009006230 A2 | * | 1/2009 | ............. H01L 31/05 |
| WO | 2011046432 A1 | | 4/2011 | |

OTHER PUBLICATIONS

PCT Patent Application PCT/US2013/025431 International Search Report and Written Opinion 14 page, Jun. 19, 2013.
PCT Patent Application PCT/US2013/025431 International Preliminary Report on Patentability, 11 page, Aug. 21, 2014.

* cited by examiner

UNCOATED SURFACE

NANO-COATING COATED SURFACE

SCREEN PRINTING APPARATUS INCLUDING SUPPORT BARS, AND METHODS OF USING SAME

CROSS REFERENCE TO RELATED APPLICATIONS

This application claims priority to U.S. Provisional Patent Applications Nos. 61/596,580, filed 8 Feb. 2012 and entitled Electroformed Accuscreen and 61/694,537, filed 29 Aug. 2012 and entitled Screen Printing Apparatus Including Support Bars, and Methods of Using Same. The above-identified patent applications are hereby incorporated by reference in their entireties.

BACKGROUND

Photovoltaic (PV) power generation is a method of generating electrical power by converting solar radiation into direct current electricity using semiconductors that exhibit the photovoltaic effect. Photovoltaic power generation employs solar panels composed of a number of cells (called "solar cells" herein) containing a photovoltaic material. Cell materials include monocrystalline silicon, polycrystalline silicon, amorphous silicon, cadmium telluride, and copper indium gallium selenide/sulfide (CIGS). Due to the growing demand for renewable energy sources, manufacturing of solar cells and photovoltaic arrays has advanced considerably in recent years. Solar cells include thin film solar cells and crystalline solar cells. Thin film solar cells are normally much larger than crystalline cells. Both crystalline solar cells and thin film solar cells include an electrode structure that collects electrons freed by photon impingement on the solar cell. The electrode structure includes finger electrodes and buss electrodes. Generally, the buss electrodes are much larger than the finger electrodes.

Thick film screens made with woven stainless steel wires are conventionally used to form solar cell electrode structures, which are often referred to as prints. A printing process produces the prints by using conductive paste or ink printed through the thick film screens (the conductive material will be called "paste" herein; it is understood that the teachings herein are equally applicable to use of thinner conductive material that may be called "ink"). A typical screen for solar printing is 325 mesh with a 0.9 mils wire diameter. The thick film screen mesh wire may stretch during printing life cycles such that printed images may distort. Thick film screens typically have an open print area of about 42%, with the best screens having an open print area of about 50%. Typical thick film screens have a base wet print thickness of about 1 mil. A common emulsion (used to block the transfer of paste in areas that are not to be printed) is about 0.5 mils thick and requires the wet print thickness to be about 1.5 mils.

As solar cells become larger and finger electrodes become smaller, thick film screens run into some limitations. When the widths of the finger electrodes approach 50 μm to 75 μm (about 2 to 3 mils), the wire diameter of the thick film screens becomes an issue in print line definition. The mesh structure becomes a greater portion of the open line width, leading to sawtooth edges where images formed by the mesh wires intersect with the intended edge. A practical limit for line resolution in the thick film screens is about 3 mils wide. As the area of the printed image gets larger, trampoline screens are required to provide precise mounting and uniform tension. However, trampoline screens are very expensive and prone to distortion during their printing life cycles. Screens can also deform under tension throughout their useful lives, leading to dimensional instability.

There remains a need for developing new screens and processes to resolve issues associated with thick film screens and trampoline screens. A simple wish list for an advanced screening technique is that sawtooth edges should be eliminated, the percentage of open area in printed areas should increase, and the image should be dimensionally stable throughout its useful life.

SUMMARY

In an embodiment, a method is disclosed for electroforming metal screen. The method deposits photoresist over a mandrel, and then exposes the photoresist with light through a plurality of openings in a photo tool to form hardened resist pillars. Unexposed photoresist is removed without affecting the resist pillars. The method then electroforms the metal screen in areas free of the hardened resist pillars such that the metal screen forms apertures defined by each of the resist pillars, a space between at least two of the resist pillars defining a support bar that forms at a reduced thickness as compared to portions of the metal screen that are not between the resist pillars. Finally, the method detaches the metal screen from the mandrel.

In an embodiment, a method is provided for fabricating electrodes of solar cells. The method includes electroforming a metal screen that forms a plurality of finger apertures therethrough, the metal screen including support bars that cross the finger apertures; placing the metal screen over a substrate of the solar cells; printing conductive paste through the finger apertures of the metal screen; and solidifying the conductive paste to form the electrodes.

In an embodiment, a method is provided for electroforming a metal screen. The method includes forming photoresist features on a conductive mandrel; electroforming a first metal layer on the mandrel, the first metal layer forming a plurality of finger apertures defined by the photoresist features, the first metal layer including support bars across the finger apertures at intervals; and detaching the metal screen from the mandrel.

In an embodiment, a metal screen is provided for printing solar cells. The metal screen includes a metal layer forming a plurality of finger apertures and a plurality of support bars spaced apart in a first direction, wherein the support bars are formed across the finger apertures in a second direction substantially perpendicular to the first direction.

In an embodiment, a metal screen is provided for printing solar cells. The metal screen includes a metal layer having a plurality of support bars spaced apart in a first direction and a first plurality of finger apertures, and an emulsion layer disposed over the metal layer. The emulsion layer has a second plurality of finger apertures aligned with the first plurality of finger apertures of the metal layer in the first direction, wherein the support bars cross the first plurality of finger apertures in a second direction that is substantially perpendicular to the first direction.

In an embodiment, a method is provided for forming screens for printing finger electrodes onto a solar cell. The method includes electroforming a first metal screen having finger electrode features defined therein, each finger electrode feature forming an open printing area across the width of the screen except for one or more first support bars that cross the finger electrode features in a region corresponding to one or more buss bars of the solar cell. The method also includes electroforming a second metal screen having features defined therein corresponding to the one or more buss bars.

In an embodiment, a method of screen printing electrodes onto a solar cell is provided, including printing finger electrodes onto the solar cell utilizing a first metal screen having finger electrode features defined therein, each finger electrode feature forming an open printing area across the width of the screen except for one or more large support bars, each support bar crossing the open printing area in a region corresponding to a buss bar of the solar cell, and one small support bar crossing the open printing area between and equidistantly from each pair of the buss bars in the solar cell. The method also includes printing buss bars onto the solar cell utilizing a second metal screen having buss bar features defined therein.

In an embodiment, a method is provided for electroforming a metal screen. The method includes forming a photo tool with a pattern having a number of openings. The method also includes depositing a photoresist layer over a mandrel and placing the photo tool over the photoresist layer. The method further includes exposing the photoresist layer to a collimated light through the plurality of openings to form hardened resist pillars. The method also includes removing a portion of the photoresist layer being unexposed to the light to leave the resist pillars over the mandrel. The method further includes electroforming a metal layer in areas of the removed portion of photoresist layer and peeling off the metal layer from the mandrel. The metal layer has a plurality of finger apertures interleaved with a plurality of support bars, each support bar being formed between two respective resist pillars such that the support bars have a lower height than the finger apertures.

In an embodiment, a method for fabricating electrodes of solar cells is provided. The method includes electroforming a metal screen with a plurality of finger apertures and support bars. The method also includes placing the metal screen over a substrate with photo cells. The method further includes printing conductive paste through the finger apertures of the metal screen, and solidifying the conductive paste to form electrodes over the substrate.

In an embodiment, a method is provided for electroforming a metal sheet. The method includes forming a photo tool with a pattern having a plurality of openings. The method also includes electroforming a first metal layer over a mandrel, the first metal layer having a pattern for a plurality of support bars and finger apertures. The method also includes depositing a photoresist layer over the first metal layer. The method further includes aligning the plurality of the openings of the photo tool over the photoresist layer with the pattern for the plurality of finger apertures of the first metal layer, and exposing the photoresist layer to a collimated light through the plurality of openings to form hardened resist pillars. The method still includes removing a portion of the photoresist layer being unexposed to the light to leave the resist pillars over the first metal layer, and forming a second metal layer in areas of the removed portion of photoresist layer. The method further includes peeling off the metal sheet including the first and second metal layers from the mandrel.

In an embodiment, a metal screen is provided for printing solar cells. The metal screen includes a metal layer having a plurality of finger apertures and a plurality of support bars spaced apart in a first direction. The support bars are interleaved with the finger apertures in a second direction substantially perpendicular to the first direction.

In an embodiment, a metal screen is provided for printing solar cells. The metal screen includes a metal layer having a plurality of support bars spaced apart in a first direction and a first plurality of finger apertures. The metal screen also includes an emulsion layer disposed over the metal layer. The emulsion layer has a second plurality of finger apertures aligned with the first plurality of finger apertures of the first metal layer in the first direction. The support bars are interleaved with the first plurality of finger apertures in a second direction substantially perpendicular to the first direction.

In an embodiment, a method of forming screens for printing electrodes onto a solar cell includes electroforming a first metal screen having finger electrode features defined therein, each finger electrode feature forming an open printing area across the width of the screen except for one or more first support bars that cross the finger electrode features in a region corresponding to one or more buss bars of the solar cell, and electroforming a second metal screen having features defined therein corresponding to the one or more buss bars.

In an embodiment, a method of screen printing electrodes onto a solar cell includes printing finger electrodes onto the solar cell utilizing a first metal screen having finger electrode features defined therein, each finger electrode feature forming an open printing area across the width of the screen except for one or more large support bars, each support bar crossing the open printing area in a region corresponding to a buss bar of the solar cell, and one small support bar crossing the open printing area between and equidistantly from each pair of the buss bars in the solar cell. The method also includes printing buss bars onto the solar cell utilizing a second metal screen having buss bar features defined therein.

In an embodiment, a screen for printing electrodes onto a solar cell includes a metal foil having finger electrode apertures defined therein, each finger electrode aperture forming an open printing area across the width of the screen except for one or more first support bars, each support bar crossing the open printing area in a region corresponding to a buss bar of the solar cell.

Additional embodiments and features are set forth in the description that follows, and still other embodiments will become apparent to those skilled in the art upon examination of the specification or may be learned by the practice of the invention.

BRIEF DESCRIPTION OF THE DRAWINGS

Illustrative embodiments of the present invention are described in detail below with reference to the attached drawings.

DETAILED DESCRIPTION

Figure 1:
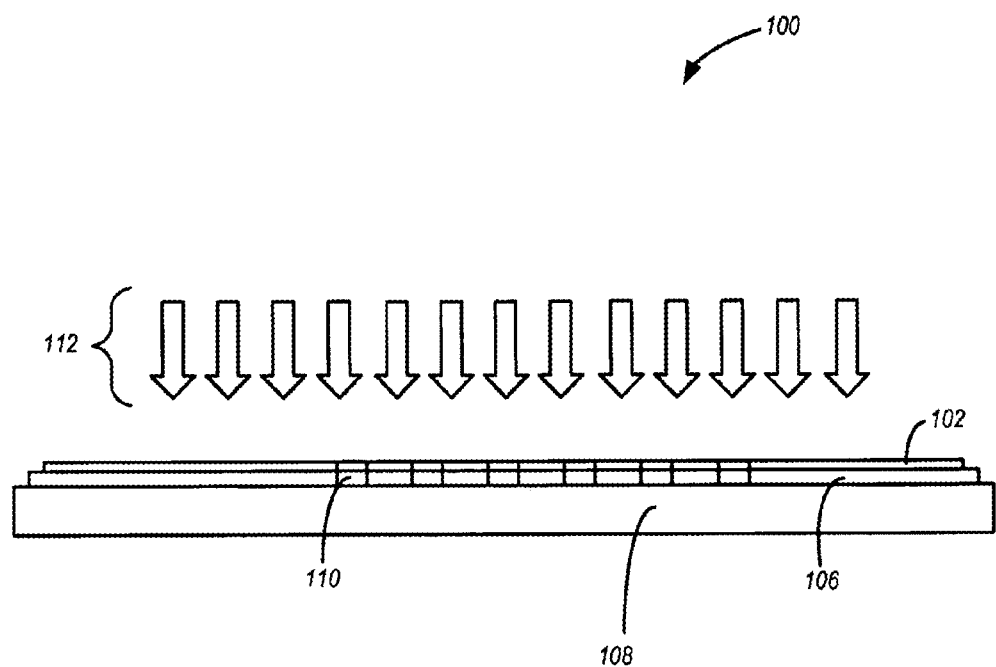
FIG. 1 illustrates hardening of resist pillars, in an embodiment.

The present disclosure may be understood by reference to the following detailed description, taken in conjunction with the drawings as described below. It is noted that, for purposes of illustrative clarity, certain elements in the drawings may not be drawn to scale. Reference numbers for items that appear multiple times may be omitted for clarity. Where possible, the same reference numbers are used throughout the drawings and the following description to refer to the same or similar parts.

This disclosure advances the art by providing a cost effective method for fabricating electroformed screens for use in screen printing. Certain electroformed screens are made and sold under the trade name "AccuScreen."

In one embodiment, an electroformed product includes support bars that are formed across narrow apertures to allow up to about 90% open print area. The support bars are narrow, such that conductive paste printed on both sides of the support bar will merge together to form a continuous printed shape. When used for solar cell fabrication, this embodiment may have an electroformed mesh in areas that print wider buss bar electrodes, or may have support bars across the buss bar areas, like the narrow apertures. The narrow support bars facilitate large open print areas (about 90%) and thus provide better paste transfer and bleed under the support bar than prior art screens. In this embodiment, large open areas feature a flat solid metal foil webbing structure such that minimal dimensional distortion is expected during their print life cycle. Line widths of 2 mils are achievable with this embodiment.

Another embodiment is similar to the embodiment described above, except that an additional emulsion layer is added. ("Emulsion" is a substance that can be patterned so as to be present in certain areas and absent in other areas; emulsion can be for example photoresist. Typically, but not by way of limitation, "emulsion" is used to describe a substance that is present as a patterned layer in a finished screen suitable for screen printing, while "photoresist" is used to describe a photosensitive substance used as a temporary mask during fabrication of the screen.) The finger widths may are as small as 50 μm in some embodiments. Screens disclosed herein may be formed using a two-layer process, with at least one electroformed metal layer and a second layer that may also be metal or may be emulsion. The second layer, when present, provides clearance for support bars present in the first layer, to make it easier for conductive paste that is forced past the support bars and through the narrow apertures during printing to merge together to form a continuous printed shape.

In contrast, another embodiment may be electroformed by a single layer process and does not require aligning two layers like the above embodiment. The single layer process is generally easier and cheaper than a multi-layer process. In this embodiment, the support bars are of partial thickness, such that conductive paste that is forced past the support bars and through the narrow apertures during printing merges together to form a continuous printed shape.

The present disclosure provides methods and structures of electroformed screens and methods for fabricating electrodes over solar cells. Electroforming is a metal forming process that forms thin metal parts by an electroplating process. A part is produced by plating a thin metal layer, such as nickel or another electroplatable metal, around resist pillars on a conductive base form, commonly called a mandrel (photoresist is sometimes referred to a simply "resist" herein and has the same meaning). The mandrel is removed after plating. The mandrel is conductive and is made either of a metal or a non-conductive material covered with a conductive coating.

FIG. 1 illustrates hardening photoresist pillars. Collimated light 112 is directed toward a multilayer structure 100, which includes a photo tool 102, a photoresist layer 106 under the photo tool 102, and a mandrel layer 108 under the resist layer 106. Photo tool 102 has a number of openings to allow collimated light 112 to pass through and harden a portion of resist layer 106, thereby forming hardened resist pillars 110 as part of a resist image on the mandrel. The unexposed photoresist is removed, such that only hardened resist pillars 110 are left on mandrel 108.

Figure 2:
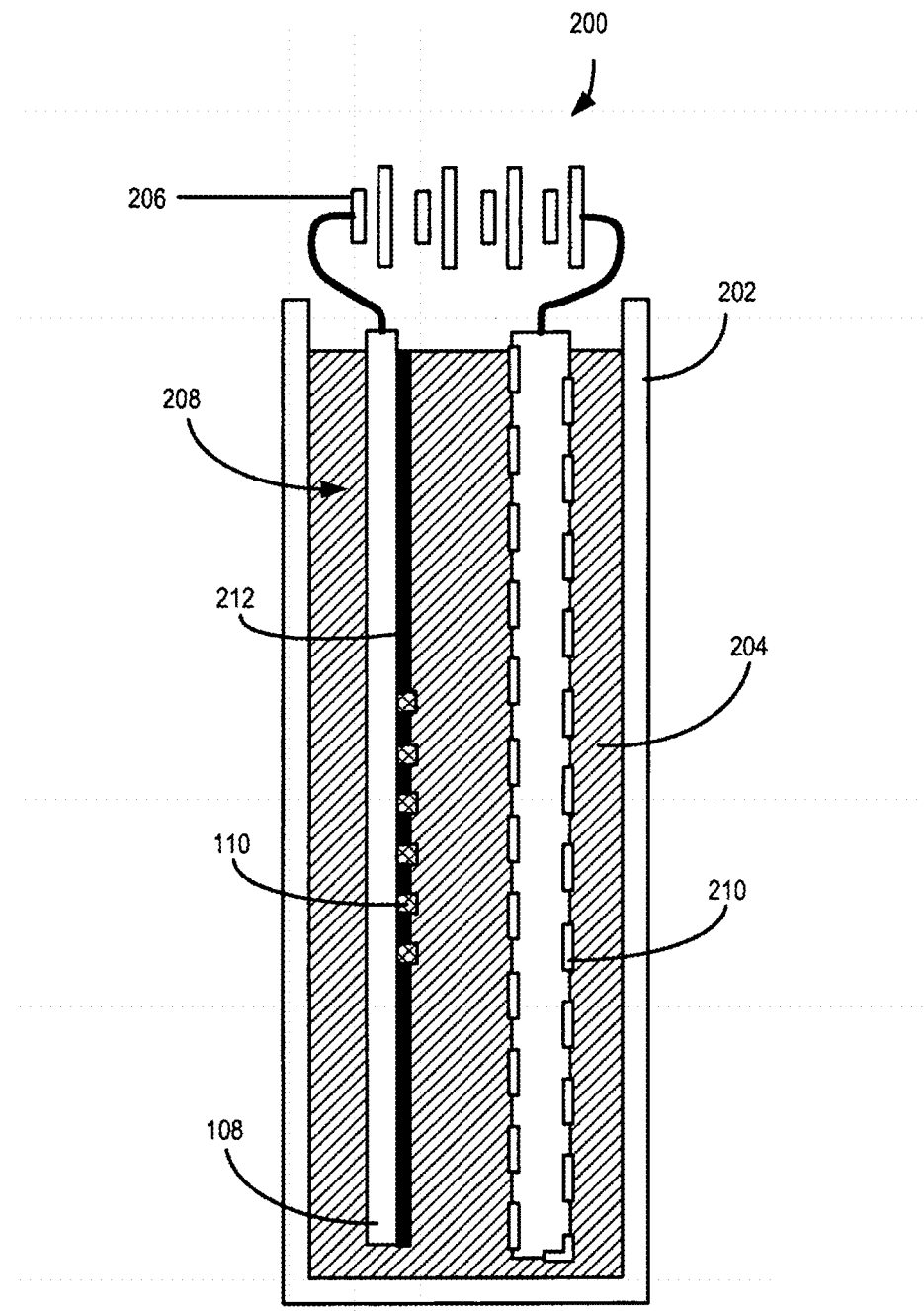
FIG. 2 illustrates generation of a screen by electroplating, in an embodiment.

FIG. 2 illustrates generation of a screen by electroplating. An electroforming device 200 includes an electroforming tank 202 containing electrolytic solution 204 and a voltage supply 206. A cathode of the voltage supply 206 is connected to a plating part 208 and an anode of the voltage supply 206 is connected to an anode bag 210 that provides a plating material that may be for example nickel pellets. The plating part 208 including mandrel 108 is oriented toward anode bag 210, such that the hardened resist pillars 110 face toward anode bag 210. Screen 212 is plated onto mandrel 108 in areas not covered by hardened resist pillars 110, as further discussed below.

Figure 3A:
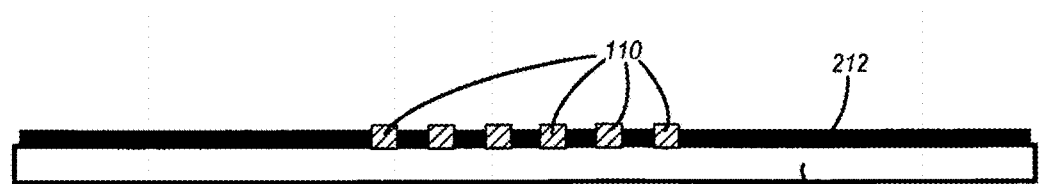
FIGS. 3A-3C illustrate a process for forming a metal screen, in an embodiment.
Figure 3B:
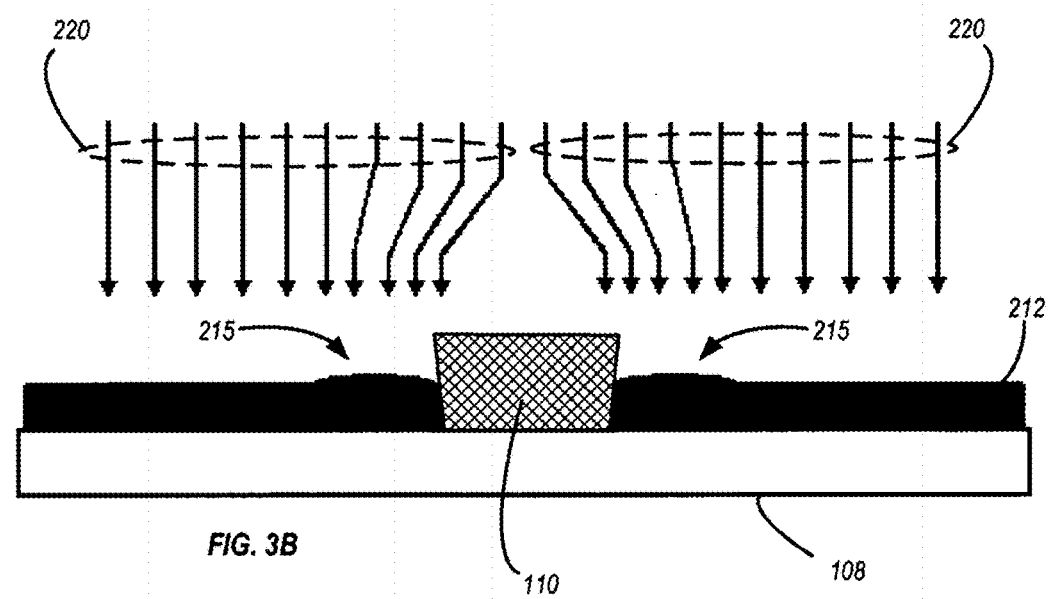
Figure 3C:

FIGS. 3A-3C illustrate a process for forming a metal screen 212. FIG. 3A schematically shows a cross section of mandrel 108 (FIGS. 1, 2) with resist pillars 110 thereon. Metal screen 212 electroplates onto mandrel 108 that are not covered by resist pillars 110. FIG. 3B is an enlarged detail of a portion of FIG. 3A during the electroplating process, and schematically shows how thickness of metal screen 212 varies in proximity of a single resist pillar 110. At a distance from mandrel 108 and resist pillar 110, a flux of metal ions 220 approaching mandrel 108 is roughly constant in cross section. However, as metal ions 220 approach mandrel 108 closely, ions 220 do not plate onto resist pillar 110, so that the flux of ions 220 increases in areas where ions 220 can plate. This causes thickened plating in locations 215 near resist pillar 110. After plating, metal screen 212 is peeled off of mandrel 108 and resist pillars 110, as shown in FIG. 3C.

Figure 4:
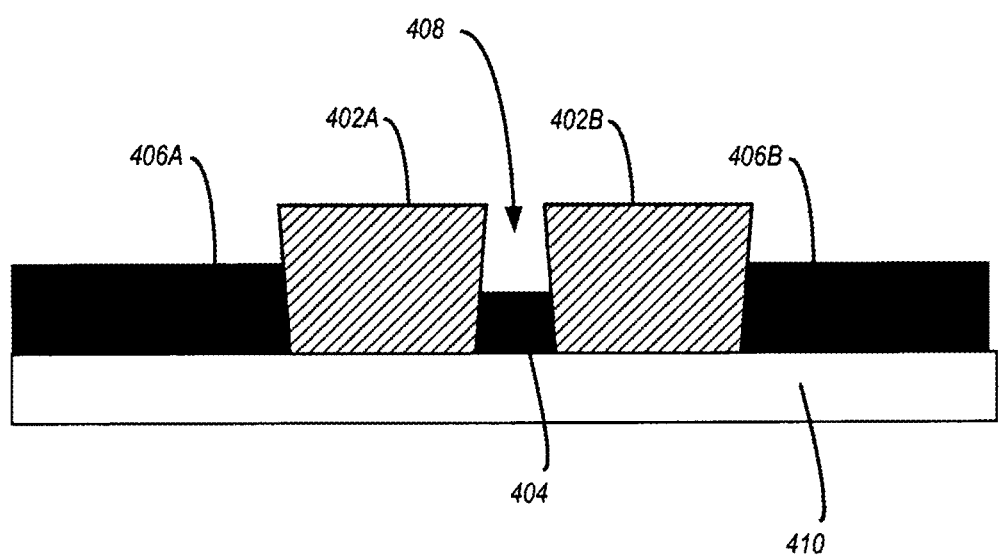
FIG. 4 illustrates a mechanism for forming support bars, in an embodiment.

FIG. 4 illustrates a mechanism for forming support bars. When two resist pillars 402A and 402B are close enough to each other, metal layer 404 between the resist pillars 402A and 402B does not plate to the full thickness achieved by metal layers 406A and 406B in more open areas. This is due to diffusion effects within the plating electrolyte. Specifically, the electrolyte within volume 408 between resist pillars 402A and 402B becomes depleted of metal ions after some of them plate out into layer 404, and the metal ion concentration within volume 408 does not come back to equilibrium with the metal concentration in the rest of the electrolyte as quickly as in larger volumes, limiting the metal ions available for deposition in layer 404.

Metal layer 404 may be utilized as a support bar in electroformed stencils. It should be noted that the side of the plating shown in FIG. 4 against mandrel 410 becomes the squeegee side of the eventual screen during printing, while the top of the plated layers (the uneven side, due to the partial thickness support bars) becomes the contact side of the screen. Therefore, the use of partial thickness support bars converts what is usually thought of as a nuisance feature (incomplete plating in narrow areas) to a useful feature. A support bar provides some mechanical stability, but purposefully does not extend down to the bottom of the contact side of the screen, so that paste can flow around the support bar and fill underneath what would otherwise be a small gap due to the support bar blocking the paste. However, other embodiments herein can advantageously utilize the mandrel side of the screen as the contact side of the screen during printing, as discussed further below.

Figure 5A:
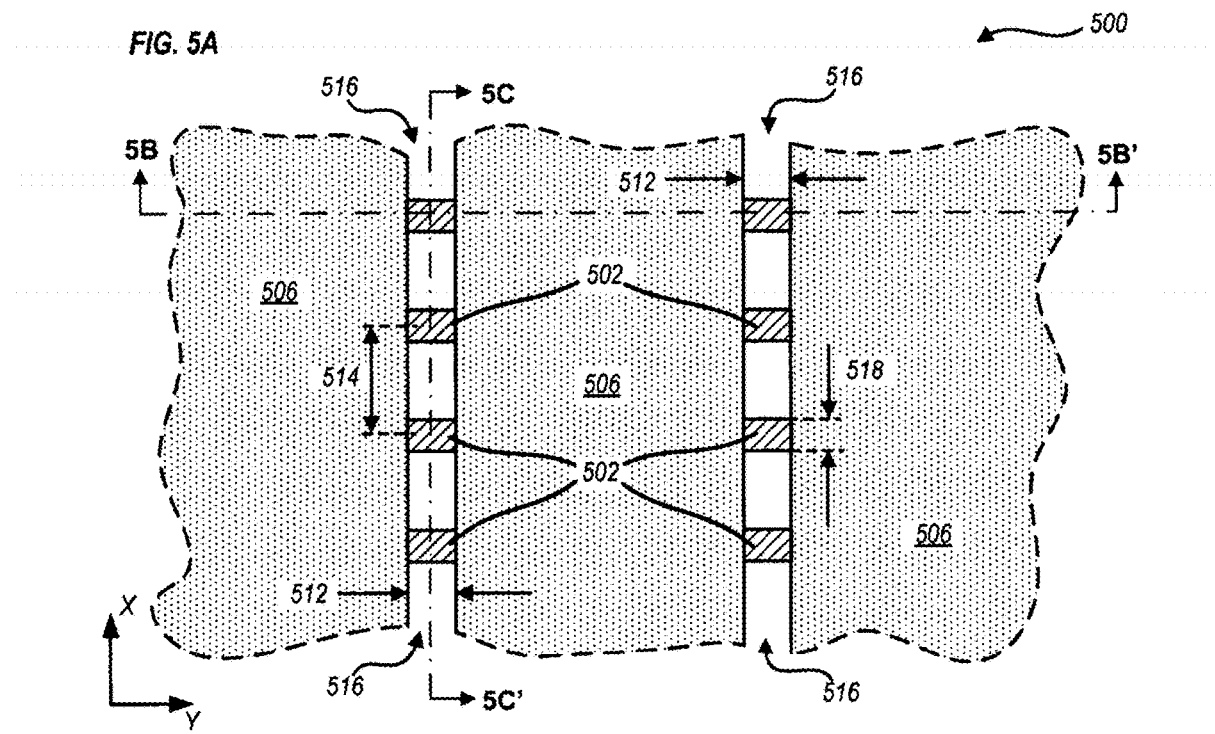
FIG. 5A is a schematic plan view of a portion of an electroformed screen, in an embodiment.

FIG. 5A is a schematic plan view of a portion 500 of an electroformed screen that is formed of metal (e.g., nickel). Broken lines 5B-5B' and 5C-5C' indicate the locations of cross-sectional views shown in FIGS. 5B and 5C respectively. Most areas of portion 500 are covered by a second layer 506 that may be formed of emulsion or of metal (e.g., nickel). Portion 500 also includes a metal layer 504 that underlies second layer 506 in the view of FIG. 5A, except for support bars 502, see also FIGS. 5B, 5C (not all instances of support bars 502 are labeled in FIGS. 5A through 5C, for clarity of illustration). Second layer 506 and metal layer 504 form apertures 516 having a width 512, with support bars 502 spaced at a pitch 514 crossing apertures 516, and each support bar 502 having a width 518, as shown. Thus, first metal layer 504 has a plurality of support bars 502 spaced apart in a first direction (an X-axis, in FIG. 5A). Second layer 506 is disposed over first metal layer 504. Second layer 506 has a plurality of apertures 516 aligned with the plurality of support bars 502 in the first direction. Support bars 502 cross apertures 516 in a second direction along a Y-axis substantially perpendicular to the first direction. The electroformed screen represented by portion 500 may be utilized as a stencil for printing fine structures such as finger electrodes, by forcing conductive paste through apertures 516.

Figure 5B:
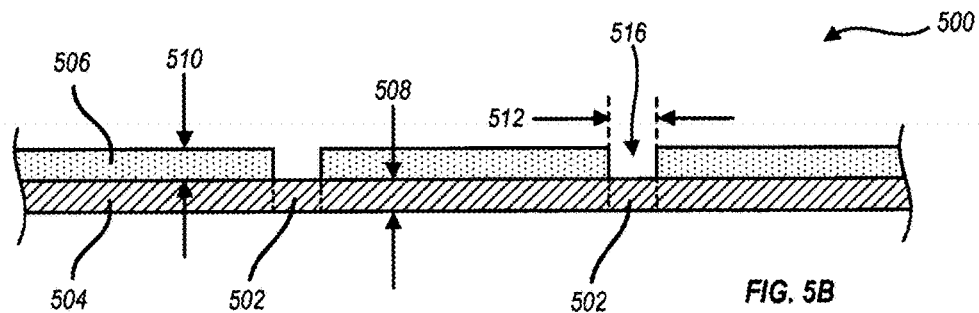
FIG. 5B is a schematic cross-sectional view of the portion of an electroformed screen of FIG. 5A.

FIG. 5B is a schematic cross-sectional view of portion 500 of an electroformed screen, taken along lines 5B-5B' in FIG. 5A. As illustrated, support bars 502 are formed as part of a first layer 504 that is formed of metal (e.g., nickel). A second layer 506 is disposed over first layer 504 and forms an opening corresponding to aperture 516 and extending above each support bar 502. Support bar 502 has a thickness 508 which is the same as a thickness of first metal layer 504, and second layer 506 has a thickness 510. Aperture 516 has a width 512. As shown, each aperture 516 extends from first metal layer 504 to second layer 506 and has a height equal to thickness 510 of second layer 506 plus thickness 508 of metal layer 504.

Figure 5C:
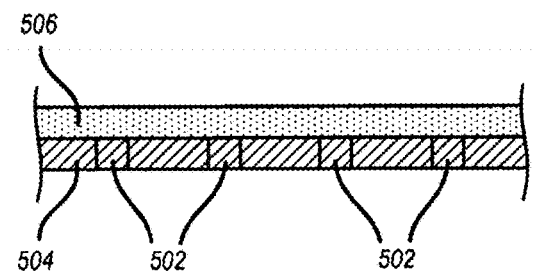
FIG. 5C is a different schematic cross-sectional view of the portion of an electroformed screen of FIG. 5A.

FIG. 5C is a schematic cross-sectional view of portion 500 of an electroformed screen, taken along lines 5C-5C' in FIG. 5A, that is, down the middle of one of apertures 516. In FIG. 5C, metal layer 504 forms a number of support bars 502 that cross apertures 516; the cross-sectional plane of FIG. 5C cuts through support bars 502, while the solid part of layer 504 is visible behind the cross-sectional plane. Second layer 506 is also visible behind the cross-sectional plane.

Figure 6A:
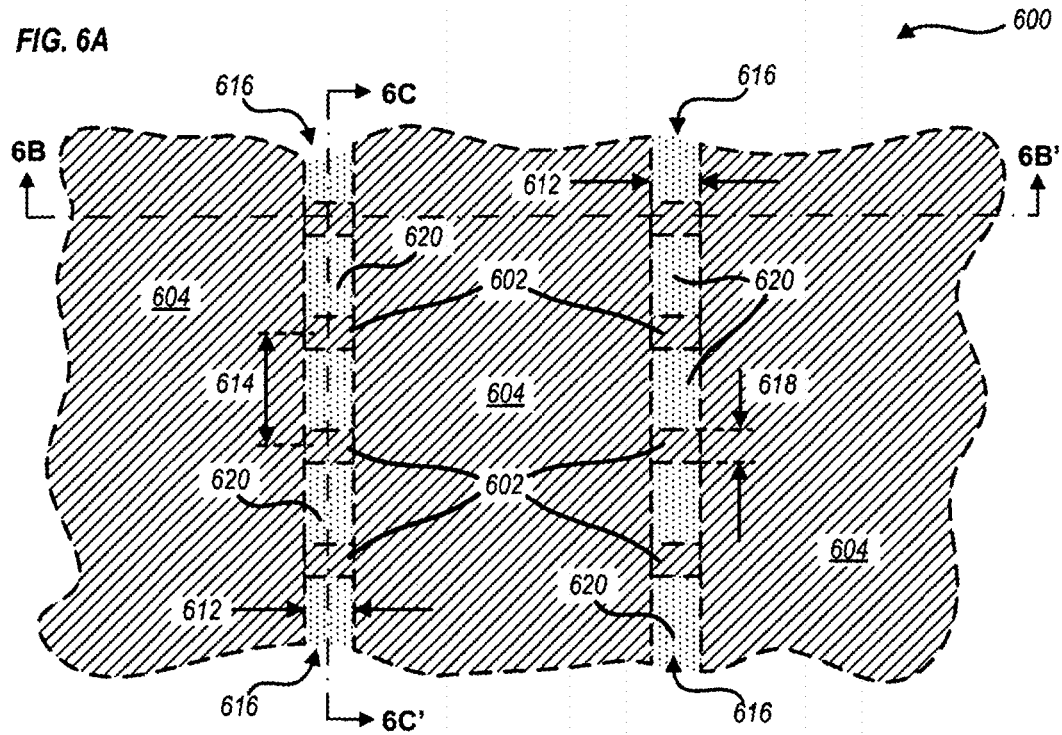
FIG. 6A is a schematic plan view of a portion of an electroformed screen during fabrication of the screen, in an embodiment.

FIG. 6A is a schematic plan view of a portion 600 of an electroformed screen during fabrication of the screen. Broken lines 6B-6B' and 6C-6C' indicate the locations of cross-sectional views shown in FIGS. 6B and 6C respectively. A metal (e.g., nickel) layer 604 forms most of the area of portion 600 except where masked by resist pillars 620. Layer 604 forms apertures 616 having a width 612. Support bars 602 having a width 618 cross apertures 616 at a pitch 614, see also FIGS. 6B, 6C (not all instances of support bars 602 or resist pillars 620 are labeled in FIGS. 6A through 6C, for clarity of illustration). Each support bar 602 forms between a pair of resist pillars 620 that limit a height of support bar 602 relative to a thickness of the rest of layer 604, as previously discussed in connection with FIG. 4. Thus, metal layer 604 has a plurality of support bars 602 spaced apart in a first direction (an X-axis, in FIG. 6A). Metal layer 604 is formed of electroplated metal that is masked by resist pillars 620 to form a plurality of apertures 616. Support bars 602 cross apertures 616 in a second direction along a Y-axis substantially perpendicular to the first direction. Resist pillars 620 are removed after formation of layer 604 and support bars 602. The electroformed screen represented by portion 600 may be utilized as a stencil for printing fine structures such as finger electrodes, by forcing conductive paste through apertures 616.

Figure 6B:
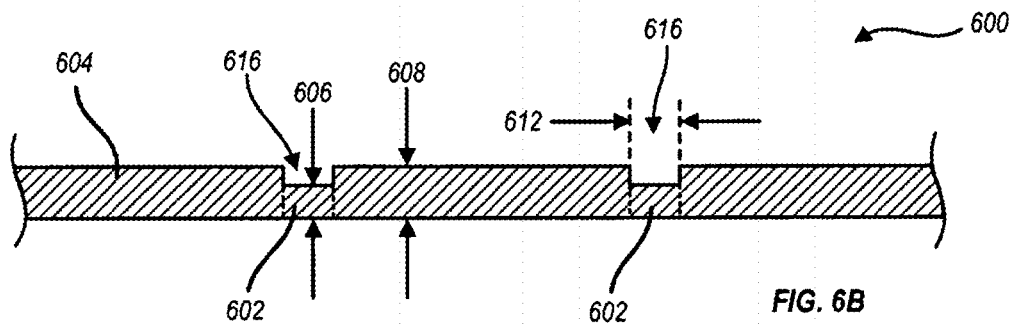
FIG. 6B is a schematic cross-sectional view of the portion of an electroformed screen of FIG. 6A.

FIG. 6B is a schematic cross-sectional view of portion 600 of an electroformed screen, taken along lines 6B-6B' in FIG. 6A. As illustrated, support bars 602 are formed with a support bar height 606 that is less than a thickness 608 of layer 604. Support bars 602 are located within apertures 616.

Figure 6C:
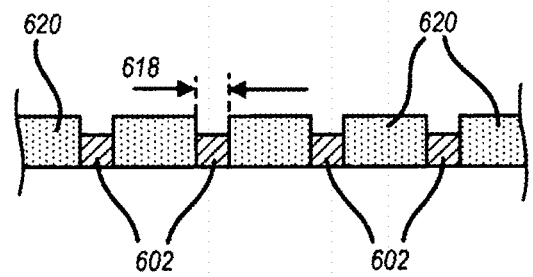
FIG. 6C is a different schematic cross-sectional view of the portion of an electroformed screen of FIG. 6A.

FIG. 6C is a schematic cross-sectional view of portion 600 of an electroformed screen, taken along lines 6C-6C' in FIG. 6A, that is, down the middle of one of apertures 616. As shown in FIG. 6C, each support bar 602 forms between two resist pillars 620. Resist pillars 620 are only used in the manufacturing process and are removed in the final device, but are shown in FIG. 6C for illustration. Support bars 602 have a width 618. Apertures 616 have a width 612, as shown in FIG. 6B.

By using the electroformed screen exemplified by portion 600, fine structures (e.g., electrode fingers) may be printed. The difference between the support bar height 606 and the metal layer thickness 608 is the gap that allows conductive paste to flow under the support bar 602 to form a continuous structure.

Figure 7:
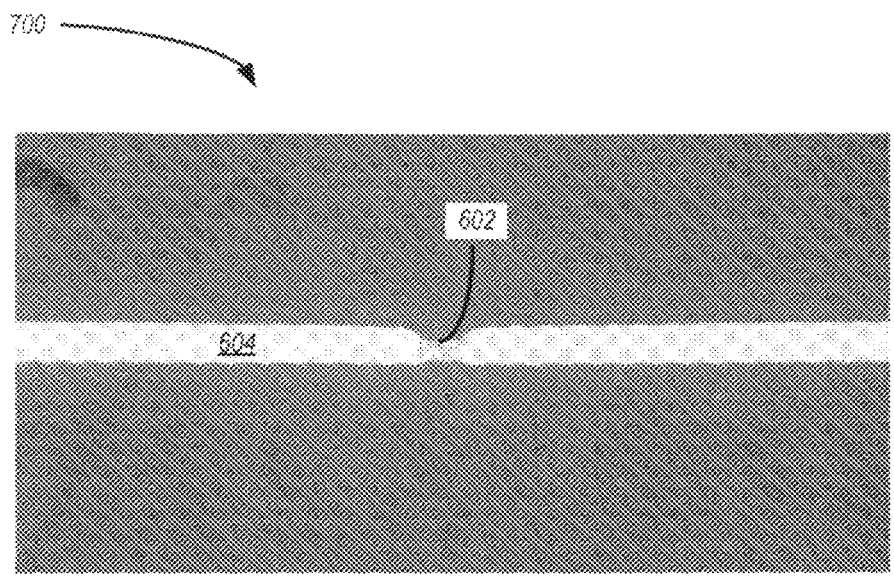
FIG. 7 shows a photo of a cross-sectional view of the electroformed screen of FIG. 6A.

FIG. 7 shows a photo 700 of a cross-sectional view of an electroformed screen exemplified by portion 600. Photo 700 shows a support bar 602 with a lower height than the bulk thickness of metal layer 604. Support bar 602 is formed as described earlier with respect to FIG. 4.

Figure 8:
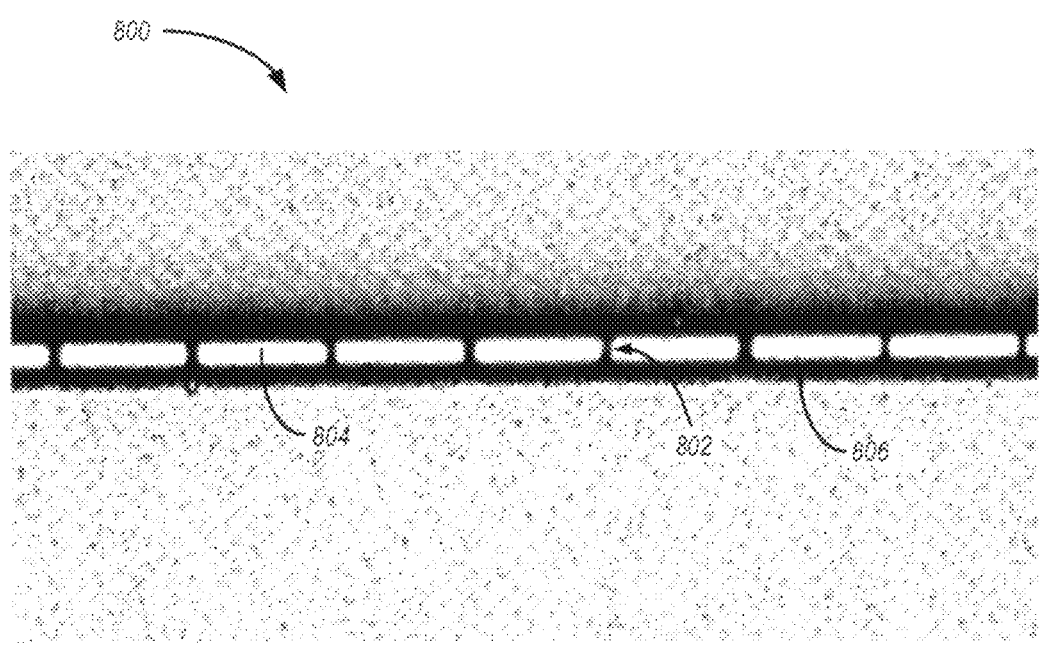
FIG. 8 shows a photo of a top view of the electroformed screen of FIG. 6A.

FIG. 8 shows a photo 800 of a top view of an electroformed screen exemplified by portion 600. Note that the screen has about support bar 802 (dark area between light areas) that is 0.5 mils wide, across a finger aperture 804 (light areas) that is about 2 mils wide, formed in metal foil 806 (dark area) that is about 2 mils thick.

As disclosed herein, support bars may have a range of widths and heights that are related to finger aperture width and bulk metal thickness for electroformed screens, and resist thickness utilized to form the screens, as exemplified by portions 500 and portion 600. These dimensions scale together, because the photoresist that defines both the apertures and the support bars must be patterned with reasonable integrity, which urges a decreased photoresist thickness, but mechanical integrity of the electroformed metal improves with increased thickness, which requires a minimum photoresist thickness so that the metal does not begin to electroplate over top of the photoresist.

For example, to form an electroformed screen in one embodiment, that has an electroformed bulk metal thickness of 1.5 to 2 mils (e.g., in large areas where proximity to photoresist pillars does not apply) the photoresist must typically be at least about 2.4 mils thick to keep the metal from plating over the photoresist. Small finger aperture widths in the screen (defined by areas of exposed, hardened photoresist) of about 1 to 3 mils can be imaged in the photoresist with good pattern integrity, with support bars (spaces in the photoresist) of about 0.5 to 1 mil crossing the finger aperture shapes. During electroplating, support bars with heights of about 0.7 to 1.5 mils will form in the narrow support bar spaces, due to metal ion depletion in the narrow spaces, as opposed to the bulk metal thickness of 1.5 to 2 mils.

In another embodiment, that has an electroformed bulk metal thickness of 2 to 3 mils, the photoresist must typically be at least about 3.5 mils thick, the support bar width ranges from 0.7 mils to 1.2 mils, and the support bar height ranges from 1.1 mils to 2.4 mils. The finger width ranges from 1.5 mils to 3.5 mils. In a further embodiment, that has an electroformed bulk metal thickness of 2.5 to 3.5 mils, the photoresist must typically be at least about 4.2 mils thick, the support bar width ranges from 0.9 mils to 1.7 mils and the support bar height ranges from 2 mils to 3 mils. The finger width ranges from 2 mils to 4 mils.

Table 1 summarizes key dimensional ranges in the electroformed screens for the above embodiments having small, medium and large electrode fingers respectively. The bulk metal thickness of each embodiment sets a lower bound for the required photoresist thickness, while the finger widths require photoresist to be thin for good pattern integrity. The photoresist thickness sets a lower bound for both the finger width and support bar width. Below the finger width ranges indicated, the required photoresist thickness will have imprecise width control and/or will disappear completely. Above the finger width ranges indicated, the electrodes will be unnecessarily wide and will block more light than desirable for high solar cell efficiency. Below the support bar width ranges indicated, the required photoresist thickness will have imprecise width control and/or will not develop out to the bottom of the resist layer at the mandrel, such that support bars will not electroform at all. Above the support bar width ranges indicated, the support bars will become too thick to properly print under (the support bar areas will not be narrow enough to suppress electroplating due to metal ion depletion).

TABLE 1

|  | Finger Width (mils) | Bulk Metal Thickness (mils) | Support Bar width (mils) | Support Bar Height (mils) |
| --- | --- | --- | --- | --- |
| Small Fingers | 1-3 | 1.5-2 | .5-1 | .7-1.5 |
| Medium Fingers | 1.5-3.5 | 2-3 | .7-1.2 | 1.1-2.4 |
| Large Fingers | 2-4 | 2.5-3.5 | .9-1.7 | 2-3 |

It is appreciated that although the methods and electroformed screens disclosed herein are discussed in terms of applicability to printing electrodes for solar cells, these methods and screens can be advantageously utilized for printing narrow, high aspect ratio features (e.g., narrow features that are at least 10 times as long as wide) for any purpose.

Figure 9:
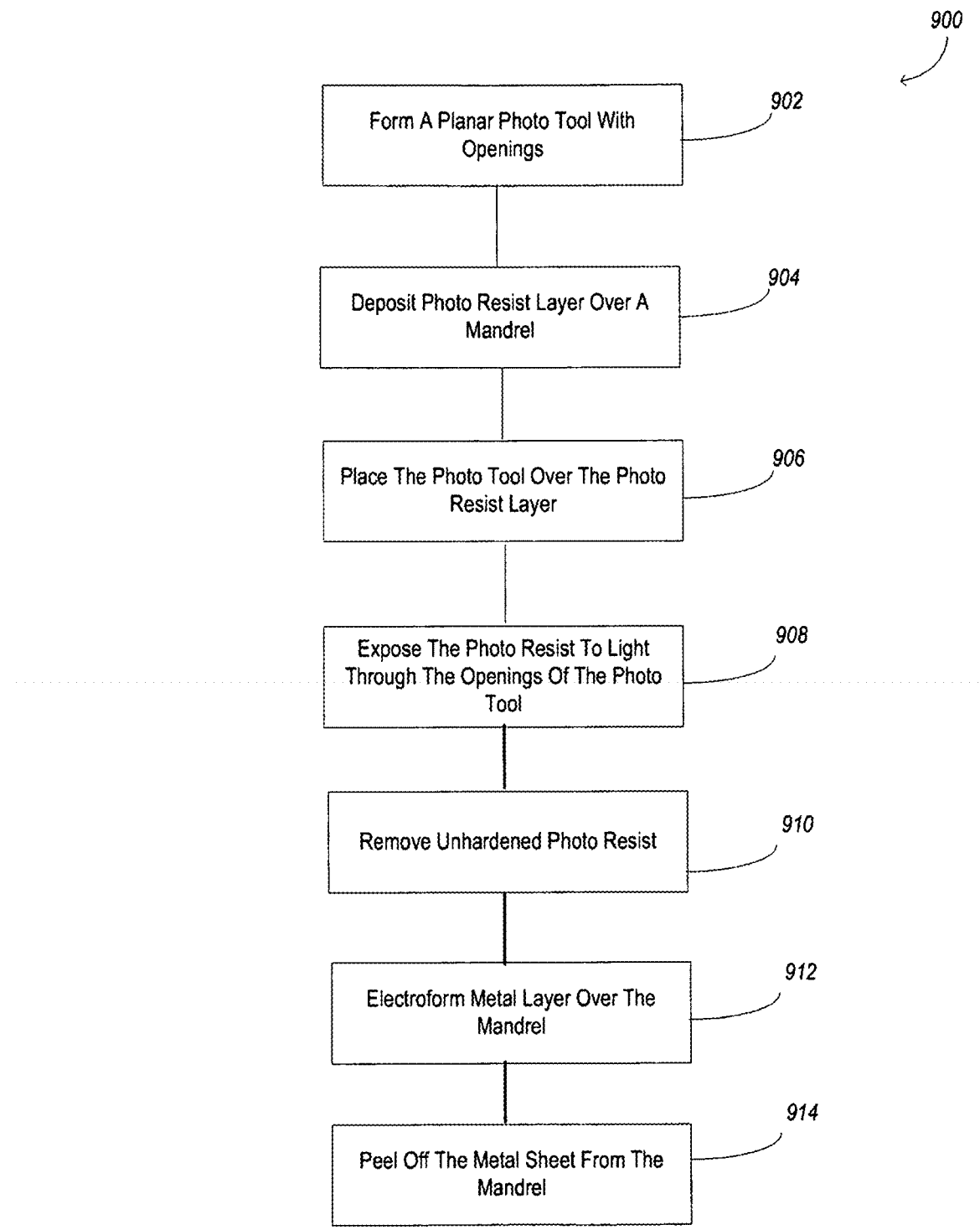
FIG. 9 is a flow chart illustrating the steps for fabricating metal foil or a metal sheet using a single layer process, in an embodiment.

FIG. 9 is a flow chart illustrating the steps for fabricating a metal foil or sheet using a single layer process. Method 900 includes forming a photo tool with a pattern having a number of openings at step 902. The method also includes depositing a photoresist layer over a mandrel at step 904, placing the photo tool over the photoresist layer, and exposing the photoresist layer to light through the openings to form hardened resist pillars at step 908. The mandrel may be made of stainless steel, copper alloy or a non-conductive material with a conductive coating. The method further includes removing an unhardened portion of the photoresist layer at step 910 and electroforming a metal layer over the mandrel at step 912, followed by peeling off the metal layer from the mandrel at step 914. The method also includes adding a nano-coating over the metal foil or sheet before fabricating a product, such as solar cell electrodes.

Electroformed screens can be used for solar printing applications. For example, electroformed screens may be used for producing solar cell electrodes. In an embodiment, by placing an electroformed screen over a solar cell substrate, and flowing conductive paste through the electroformed screen, finger electrodes would be formed. This process is called printing. The electroformed screens and a metal layer define finger traces that can be as thick as 75 to 100 μm. A mesh pattern is electroformed to define the mesh pattern over the open finger traces.

Printing requirements typically differ between crystalline solar cells and thin film solar cells. Normally, crystalline solar cells require a conductive glass frit type paste fired at high temperatures. On the other hand, thin film photo panels normally require silver filled printable epoxy. The conductive paste may include silver pastes. For example, polymer based silver paste, such as epoxy based silver paste, is typically used in thin film solar cells. Polymer based silver paste may be provided by, for example, Indium Corporation. Glass frit based silver paste is commonly used for crystalline solar cells. Glass frit based silver paste may be provided by, for example, Heraeus or Dupont.

Figure 10A:
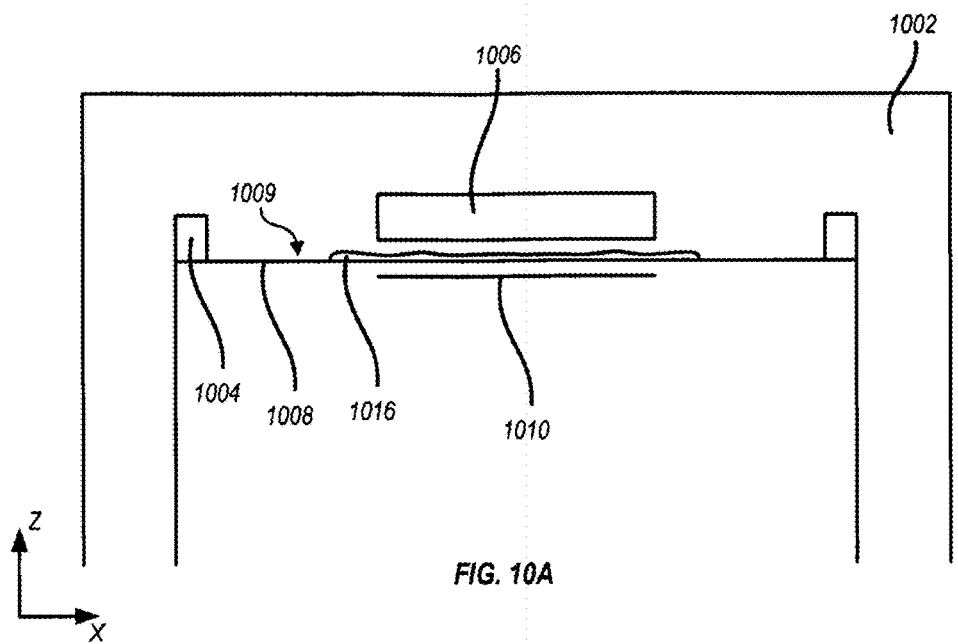
FIG. 10A is a simplified, schematic cross-sectional system diagram illustrating fabricating a product using an electroformed screen, in an embodiment.

FIG. 10A is a simplified, schematic cross-sectional system diagram illustrating fabricating a product using an electroformed screen. System 1000 positions substrate 1010 and electroformed screen 1008 in an X-Y plane (each of the substrate and screen is reduced to a line in the X-Z plane shown in FIG. 10A). Printing direction, squeegee direction, and paste spreading direction are along the Y-axis. System 1000 includes a printer 1002, which is normally automated with controls for squeegee speed, squeegee pressure, screen off contact spacing, and flood print or print flood cycles. System 1000 also includes frame 1004 for mounting electroformed screen 1008 to printer 1002. Frame 1004 holds electroformed screen 1008 taut. Conductive paste 1016 (e.g. silver paste) is placed on a top surface 1009 of electroformed screen 1008. System 1000 also includes a squeegee 1006 that spreads conductive paste 1016 on a surface of electroformed screen 1008 by moving front to back in a squeegee direction along the Y-axis. This process is referred to as a flood process. Next, the squeegee 1006 comes in contact with the surface of electroformed screen 1008 and moves paste 1016 from back to front in an opposite direction from the paste spreading direction along the Y-axis. There may be a spacing between a bottom surface of electroformed screen 1008 and substrate 1010 called off-contact distance or snap-off distance, which allows electroformed screen 1008 to break away from substrate 1010 during a printing operation.

Figure 10B:
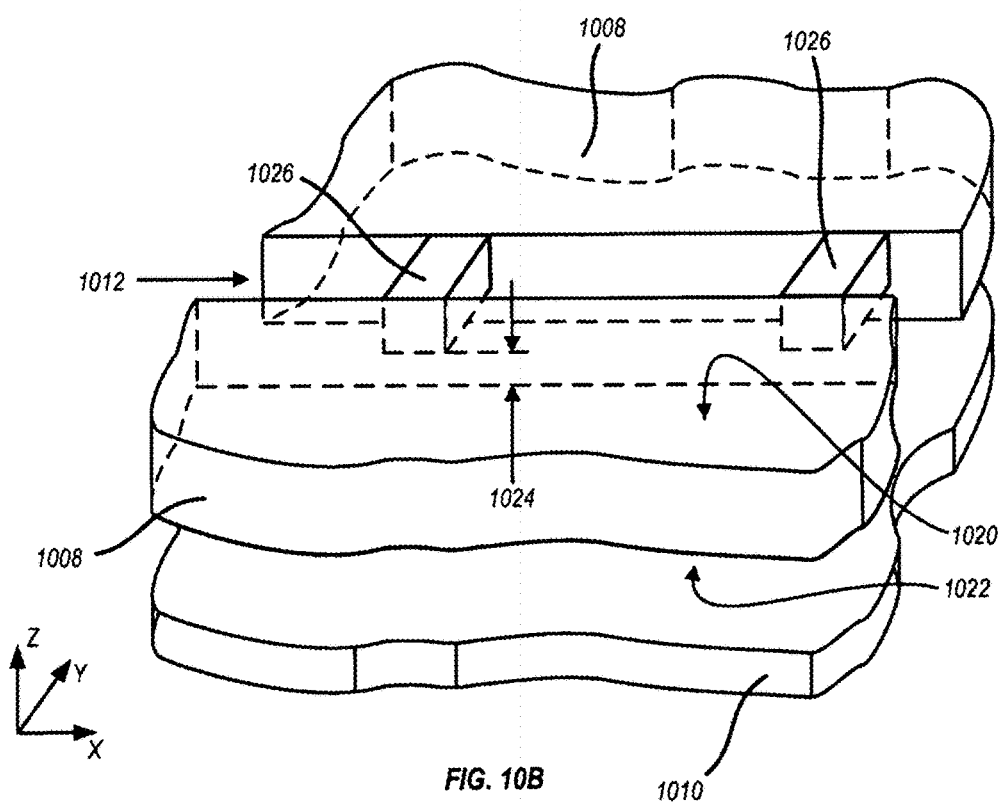
FIG. 10B is an enlarged perspective view of respective portions of the electroformed screen and substrate shown in FIG. 10A, in an embodiment.

FIG. 10B is an enlarged perspective view of respective portions of electroformed screen 1008 and substrate 1010 of FIG. 10A. In the portions shown in FIG. 10B, electroformed screen 1008 has an aperture 1012 that is crossed by support bars 1026 spaced along aperture 1012. Support bars 1026 do not extend all the way to the bottom of screen 1008 (e.g., the surface of screen 1008 nearest substrate 1010), thus leaving a gap 1024 for paste 1016 to spread under support bars 1026 and thus form continuous printing lines on substrate 1010.

The amount of paste spread may be determined by viscosity of the conductive paste. The conductive paste may have various viscosities. Generally, low viscosity paste spreads more than high viscosity paste. To achieve small finger line width less than 100 μm, higher viscosity paste is used to promote low paste spreading. However, very high viscosity past may result in broken conductor lines. Very low viscosity paste, on the other hand, may spread too much, resulting in excessively wide print lines that block photons from striking a solar cell surface, thereby reducing solar cell efficiency.

Figure 11A:
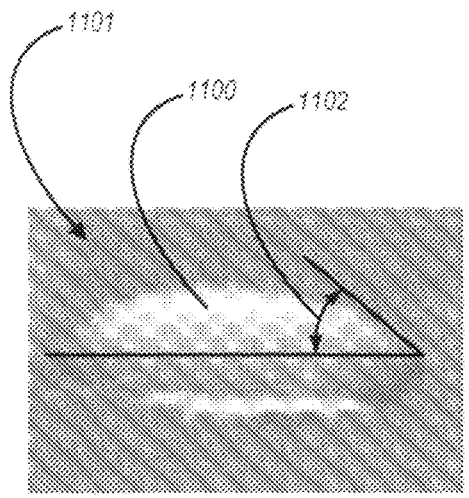
FIG. 11A is a photo illustrating an untreated electroformed screen surface and an electroformed screen with a nano-coating surface, in an embodiment.
Figure 11B:
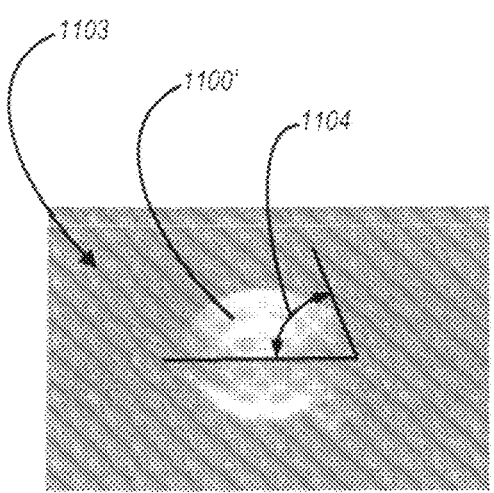
FIG. 11B illustrates cleaning effects of a treated surface and an untreated surface in an embodiment.

FIG. 11A is a photo illustrating an untreated electroformed screen surface and FIG. 11B is a photo illustrating a treated electroformed screen surface with a nano-coating in an embodiment. The nano-coating is a finishing process for an electroformed screen. The advantages of the finishing process include reduced production cost, faster production cycle, lower product defects and higher yield, for example, in solar cell electrodes. The photos were taken after measured drops of flux 1100, 1100' were placed on uncoated and coated surfaces 1101 and 1103 respectively. FIGS. 11A and 11B demonstrate that an uncoated surface 1101 produces a smaller contact angle 1102 than a contact angle 1104 produced by coated surface 1103. Clearly, a higher flux contact angle is obtained with coated surface 1103.

Figure 11C:
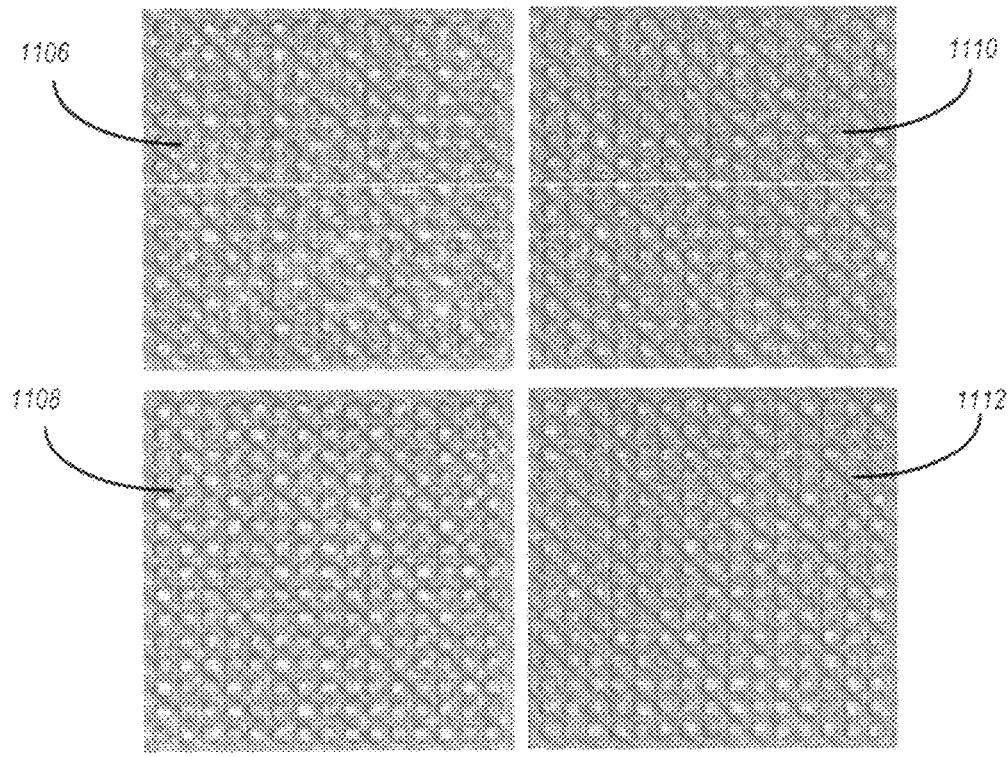
FIG. 11C illustrates cleaning effects on a nano-coating treated surface and an unrelated surface.

FIG. 11C illustrates cleaning effects on a nano-coating treated surface and an untreated surface. The photograph labeled 1106 shows a print made from a screen that has been used to generate 14 prints without cleaning. The photograph labeled 1108 shows a print made from a screen that has a nano-coating, that has also been used to generate 14 prints without cleaning. Screens 1110 and 1112 show prints made from the same screens as screens 1106 and 1108 respectively, after the screens have been cleaned. As shown in FIG. 11C, the print made from uncoated screen 1110 looks similar to the print made from coated screen 1112 after cleaning. However, uncoated screen 1106 requires a longer cleaning cycle than coated screen 1108.

Referring to FIG. 10B again, a nano-coating is applied on a bottom surface 1022 of electroformed screen 1008 that makes contact with substrate 1010. The nano-coating also flows up into the slits or apertures 1012. However, the squeegee side or top surface 1020 of electroformed screen 1008 does not have a nano-coating. The finger slits or apertures 1012 should be aligned generally parallel to the squeegee stroke so that the print direction is down the long length of the finger apertures or slits in the Y-axis.

Figure 12:
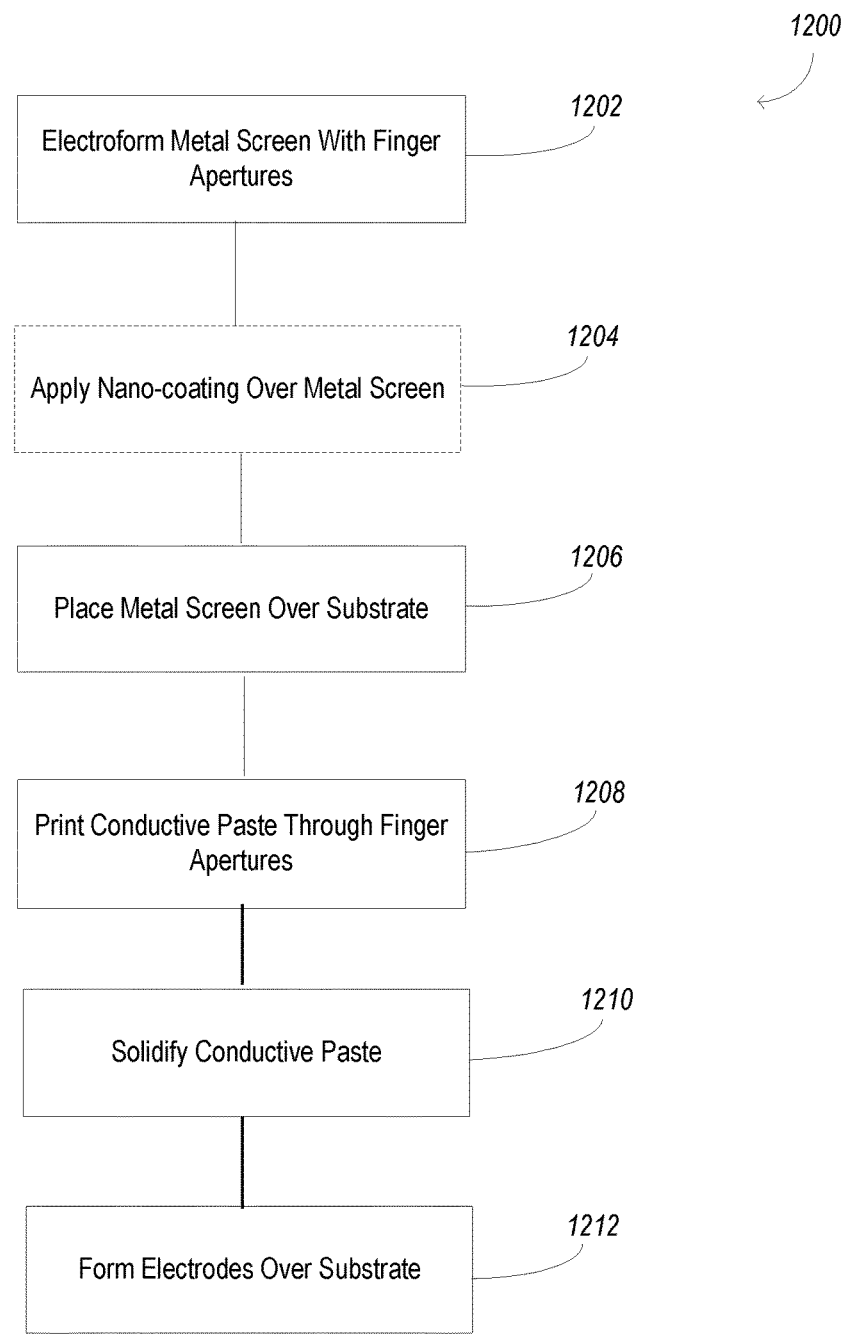
FIG. 12 is a flow chart illustrating steps for fabricating a product, in an embodiment.

FIG. 12 is a flow chart illustrating the steps for fabricating products using an electroformed screen, in an embodiment. Method 1200 includes electroforming an electroformed screen with finger apertures and support bars at step 1202. Method 1200 may optionally include applying a nano-coating over the electroformed screen at step 1204, as shown in dash-line. Method 1200 also includes placing the electroformed screen over a solar cell substrate such that the nano-coating is disposed between the electroformed screen and the substrate at step 1206. Method 1200 also includes printing conductive paste through the finger apertures of the electroformed screen at step 1208. Method 1200 further includes solidifying the conductive paste at step 1210 and forming electrodes over the substrate at step 1212.

Figure 13A:
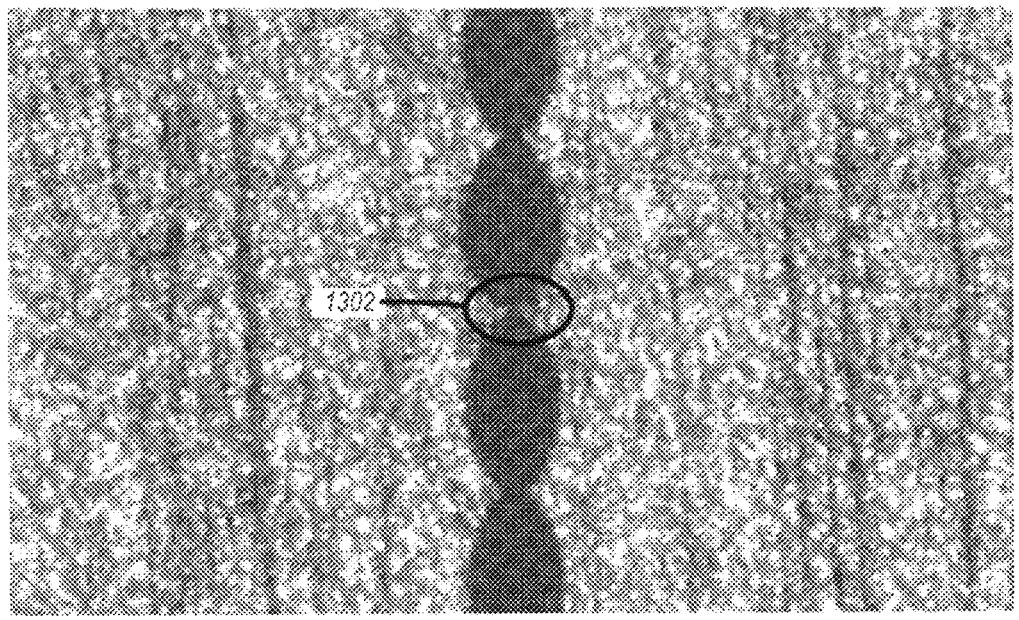
FIG. 13A is a photo of printing results from a self-aligning electroformed screen with support bars of 1.1 mils wide, in an embodiment.
Figure 13B:
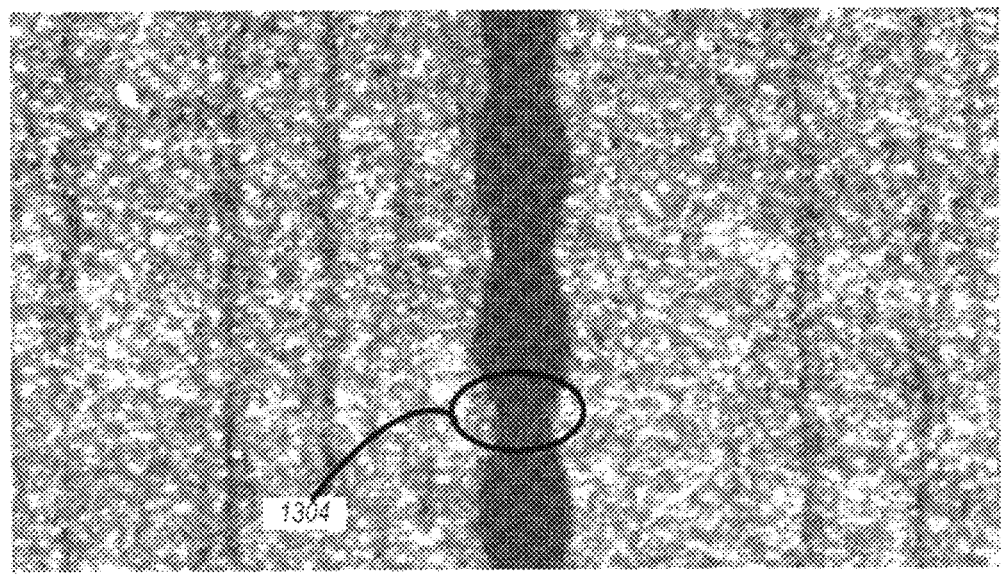
FIG. 13B is a photo of printing results from a self-aligning electroformed screen with support bars of 0.7 mils wide, in an embodiment.
Figure 13C:
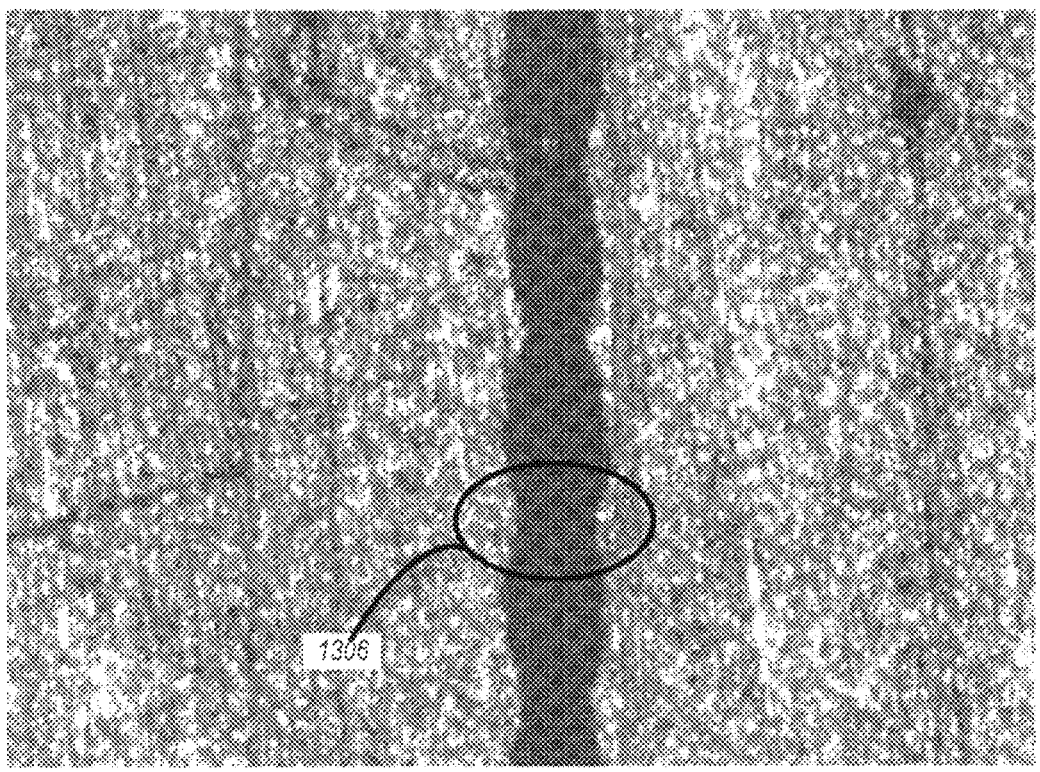
FIG. 13C is a photo of printing results from a self-aligning electroformed screen with support bars of 0.5 mils wide, in an embodiment.

FIGS. 13A-C are photos that illustrate print results of electroformed screen according to portion 600. FIG. 13A shows a print when the support bar is 1.1 mils wide. FIG.

13B shows a print with support bars of 0.7 mils wide. FIG. 13C shows a print with support bar of 0.5 mils wide. As shown in FIGS. 13A-13C, the finger electrode paste print 1302 obtained with wider support bars is narrower than the finger electrode paste prints 1304 and 1306 obtained with narrower support bars such that the finger electrode paste prints 1304 and 1306 in FIGS. 13B and 13C are not broken but the finger electrode paste prints 1302 in FIG. 13A are broken. These results illustrate that if the support bar is too wide and thus tall, such as the print obtained with a 1.1 mil support bar as shown in FIG. 13A, the finger electrode paste print 1302 will be broken. When the support bar is narrow and has a lower height, such as 0.5 mils or 0.7 mils, the support bar allows paste to flow under the support bar. If the resist pillars shown in FIG. 4 are too far apart, resulting in a wide and tall support bar, a second layer as shown in FIGS. 5A-5B helps the paste bridge the gap beneath the support bar.

Figure 14:
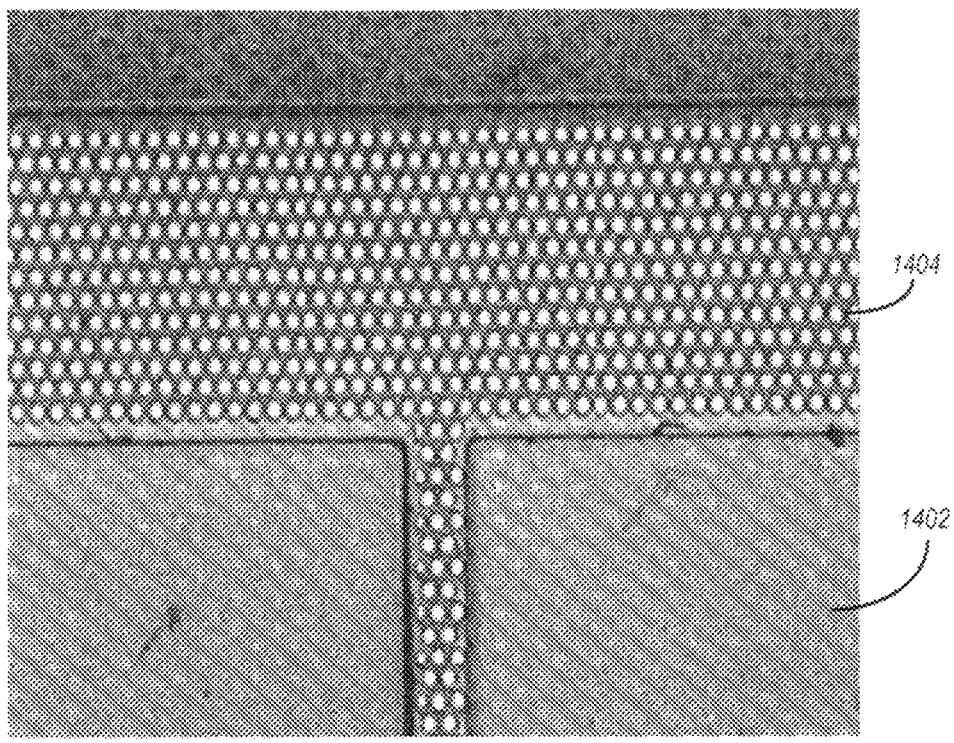
FIG. 14 is a photo of an electroformed screen with 1 mil mesh and 2 mils electroformed build-up, in an embodiment.

In an embodiment, an electroformed screen has an electroformed mesh with an electroformed build-up defining a print area. The mesh may be a hexagonal mesh. An example of this configuration is shown in FIG. 14, which is a photo of an electroformed screen with 1 mil mesh 1404 and 2 mils electroformed build-up 1402. Since the mesh is electroformed, it is flat like a stencil, without the weave knuckles that characterize stainless steel mesh. This flatness promotes dimensional image stability during use and prolonged usage life. However, the open area is very similar to thick film screens, i.e. only about 50% of the "open" area is open.

Figure 15:
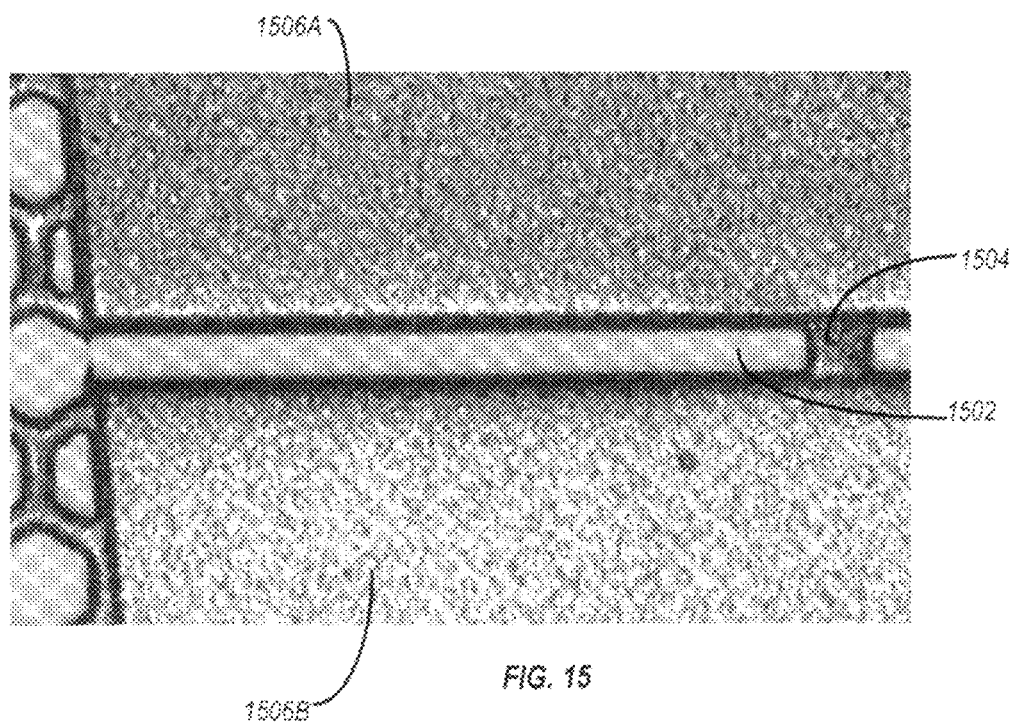
FIG. 15 is a photo of an electroformed screen with a 2 mil wide finger aperture, a 2 mil wide support bar, and 1.5 mil electroformed build-up, in an embodiment.
Figure 16:
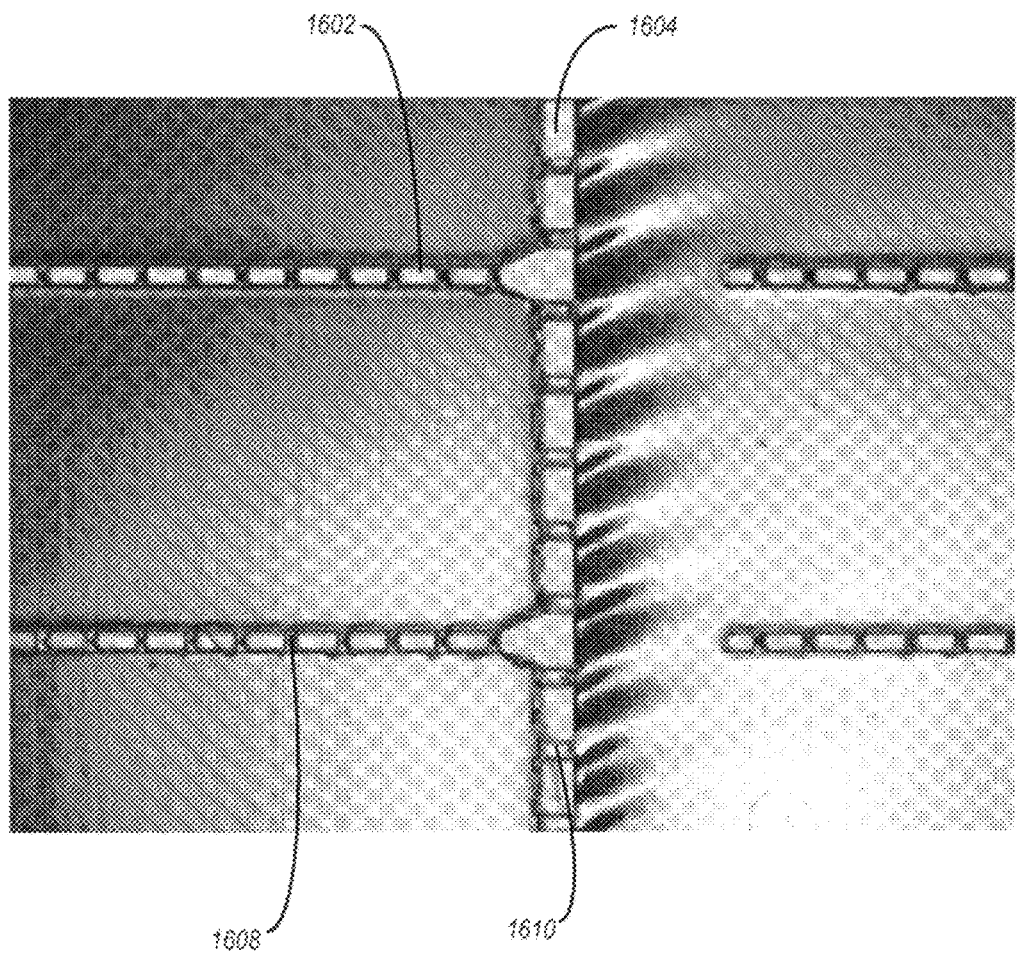
FIG. 16 is a photo of an electroformed screen with support bars for both finger electrodes and buss electrodes, in an embodiment.

Certain electroformed screens the electrode fingers are formed differently. Instead of the hexagonal mesh pattern, narrow support bars stretch across the open fingers at a repetitive interval. In this manner, the open area can be as much as approximately 90%. As before, the first electroformed layer is of the order of 1 mil and the electroformed build-up is of the order of 1 to 2 mils. The buss electrodes may be configured the same way as the finger electrodes with support bars. In an alternative embodiment, if the buss electrodes are wide, they may have a hexagonal mesh. FIG. 15 is a photo of an electroformed screen with 2 mil wide fingers 1502, 2 mil wide support bars 1504, and 1.5 mil electroformed build-up 1506A-B which are first and second metal layers. In this case, the buss electrode is wide so that a mesh pattern is employed. FIG. 16 is a photo of an electroformed screen with support bars 1608 for finger electrodes 1602 and support bars 1610 for buss electrodes 1604. Buss electrodes 1604 are larger than finger electrodes 1602, as shown in FIG. 16.

Figure 17:
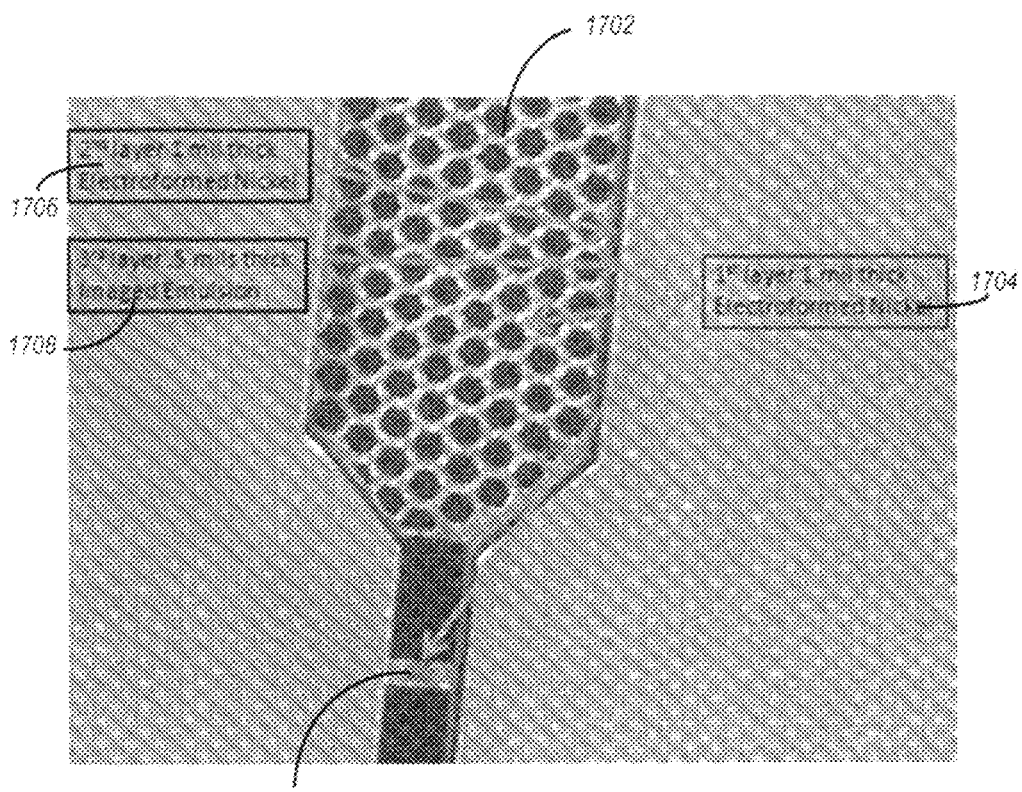
FIG. 17 is a photo of an electroformed screen with 1 mil thick finger support bars, a 1 mil thick buss mesh, 1.5 mil electroformed build-up for finger electrodes and buss electrodes, and an 0.5 mil emulsion build-up for finger electrodes and buss electrodes, in an embodiment.

In certain electroformed screen embodiments, a layer of emulsion is added on top of the electroformed image build-up area. This configuration is shown in FIG. 17, which is a photo of an electroformed screen with 1 mil thick for finger support bars 1710 and a buss mesh 1702, 1.5 mil electroformed build-ups 1704 and 1706 (first and second metal layers) for finger and buss electrodes, 0.5 mil emulsion build-up 1706 for the finger and buss electrodes.

Figure 18:
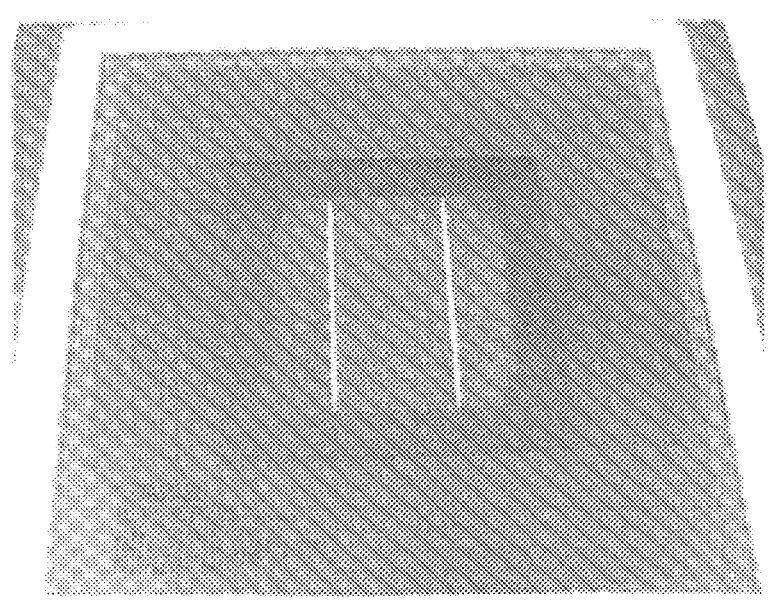
FIG. 18 is a photo of an electroformed screen for a 5 inches by 5 inches (125 mm) crystalline solar cell with 3.15 mils (80 μm) wide fingers, in an embodiment.

An example of an electroformed screen for printing electrodes on a crystalline wafer is shown in FIG. 18, which is a photo of an electroformed screen for a five inch by five inch (about 125 mm) crystalline solar cell with 3.15 mil (80 µm) wide fingers. The emulsion used in the electroformed screen aids in forming a tight gasket between the electroformed screen and the substrate. This is useful for conductive epoxies with low viscosities, to keep the printed epoxy paste from spreading to unwanted areas.

Figure 19:
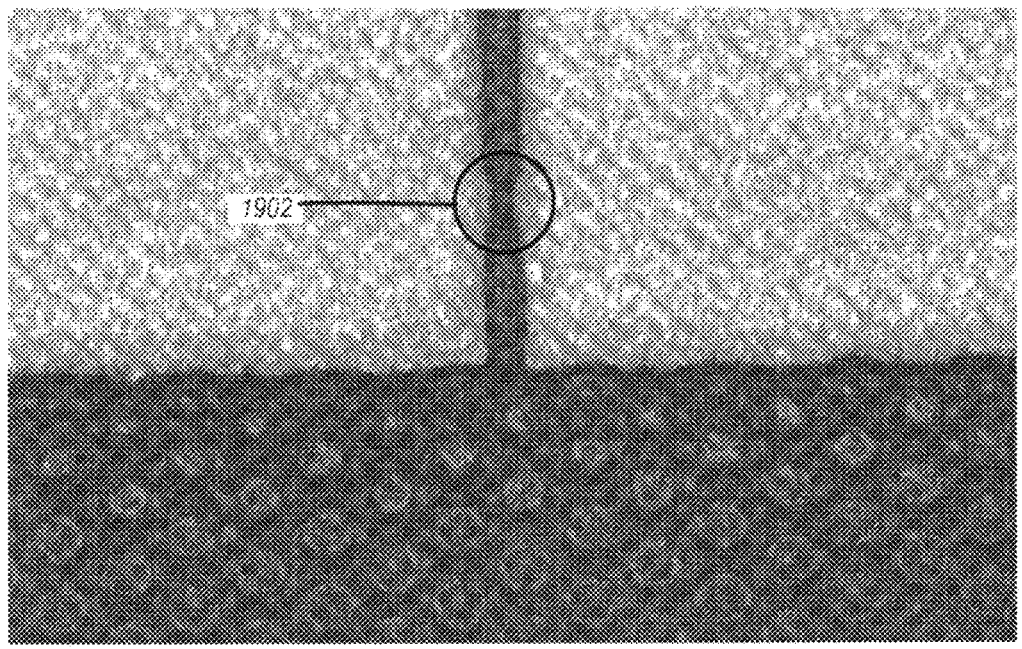
FIG. 19 is a photo of finger and buss prints for 4 mils wide finger electrodes and 80 mils wide buss electrodes for a crystalline cell, in an embodiment.

The printing areas for crystalline solar cells and thin film solar cells are quite different, typically 25 square inches for crystalline solar cells and about 300 square inches for thin film solar cells. FIG. 19 is a photo of finger and buss prints for 4 mil wide fingers and 80 mil wide buss electrodes for a crystalline cell. Note that there is a slight narrowing of the finger line width at the support bar location (see circled area 1902).

Figure 20:
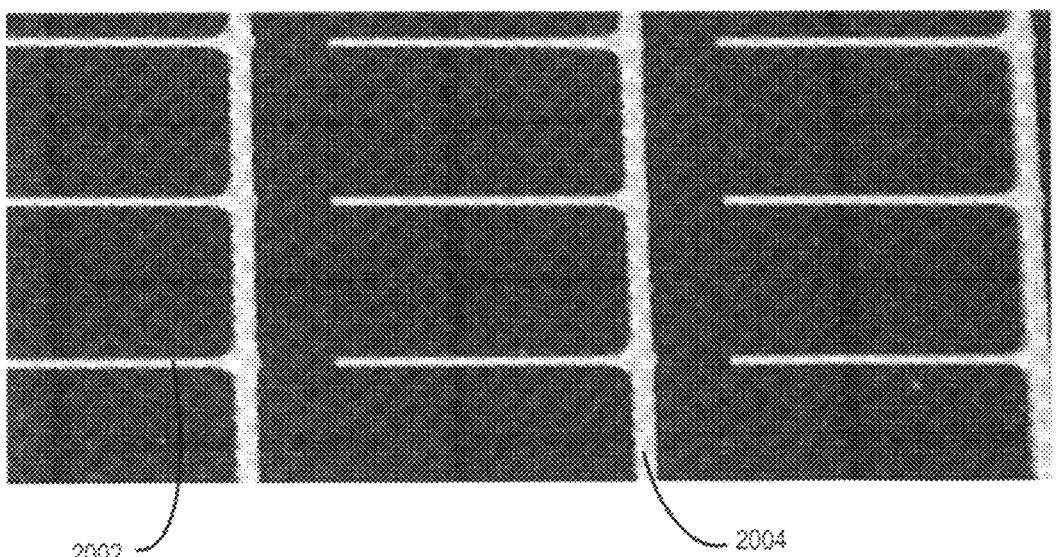
FIG. 20 is a photo of finger and buss prints for a thin film solar panel with a CIGS photo cell, in an embodiment.

FIG. 20 is a photo of finger and buss prints for a thin film solar cell. A semi-transparent dummy panel shows 5 mil wide finger prints 2002 and 15 mil wide buss prints 2004. The finger prints and buss prints include conductive epoxies. The total print area is about two hundred-and-eighty square inches.

Figure 21:
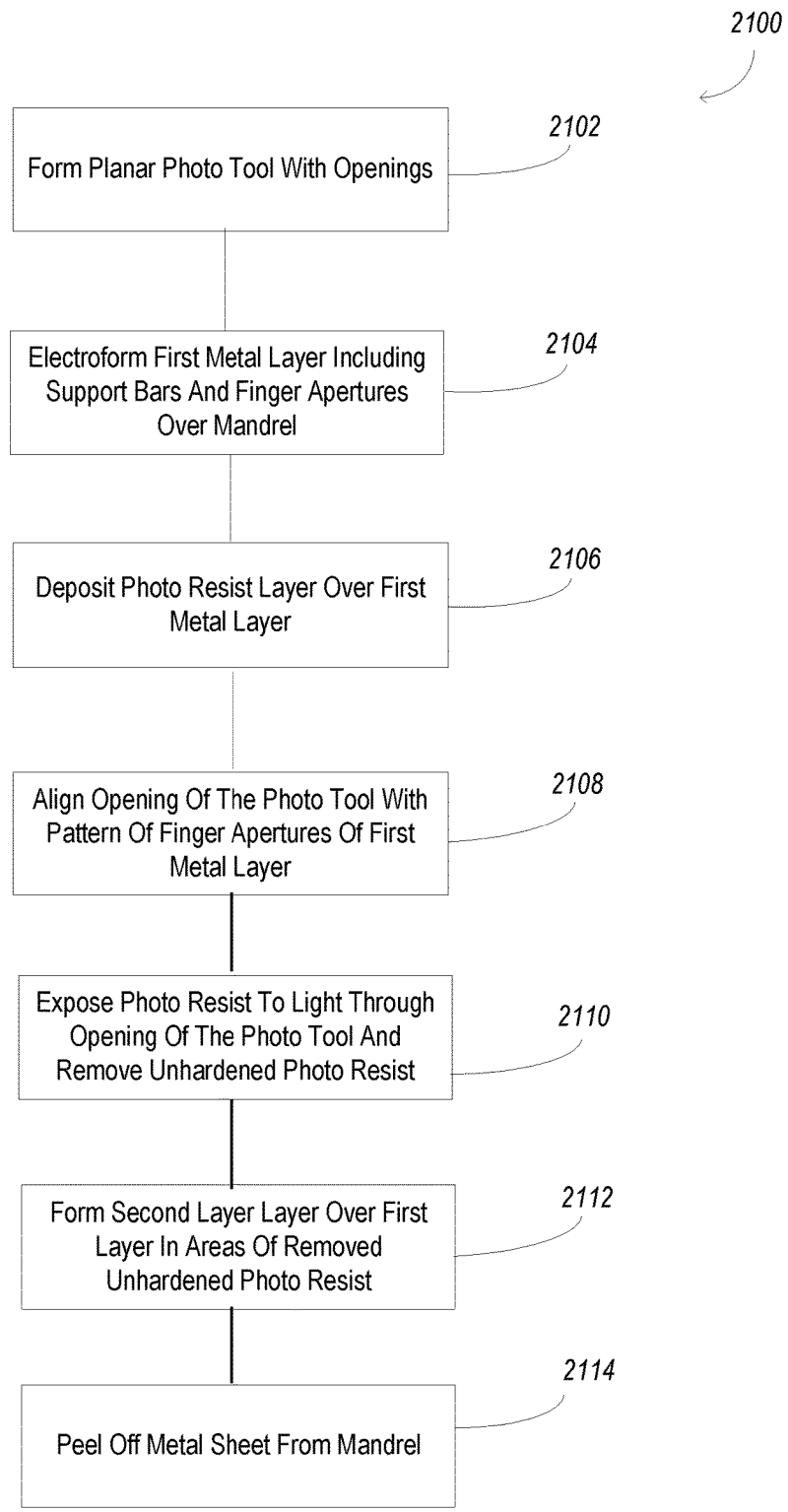
FIG. 21 is a flow chart illustrating steps for fabricating metal foil or a metal sheet using a two-layer process, in an embodiment.

FIG. 21 is a flow chart illustrating the steps for fabricating metal foil or a metal sheet using a two-layer process, in an embodiment. Method 2100 includes forming a photo tool with a pattern having a plurality of openings at step 2102. Method 2100 also includes electroforming a first metal layer over a mandrel at step 2104. The first metal layer has a pattern for a plurality of support bars interleaved with a plurality of finger apertures. Method 2100 also includes depositing a photoresist layer over the first metal layer at step 2106 and aligning the plurality of the openings of the photo tool over the photoresist layer with the pattern for the plurality of electrode finger apertures of the first metal layer at step 2108. Method 2100 further includes exposing the photoresist layer to a collimated light through the plurality of openings to form hardened resist pillars and removing a portion of the photoresist layer being unexposed to the light to leave the photoresist layer pillars over the first metal layer at step 2110, and forming a second metal layer in areas of the removed portion of photoresist layer at step 2112. Method 2100 still further includes peeling off the metal sheet including the first and second metal layers from the mandrel at step 2114.

In still other embodiments, finger structures can be applied to solar cells in a first pass screening, followed by a second pass screening to apply coarser features orthogonal to the finger structures. Separation of the first and second pass screening allows each screening to be optimized for simplicity, best solar cell characteristics, and cost savings, as compared to prior art apparatus and methods. These and other embodiments can also provide screens with openings in the metal about the periphery of the screen, with emulsion over the openings, to provide strain relief to features closer to the middle of the screen without printing through the openings. These embodiments are now described.

Figure 22A:
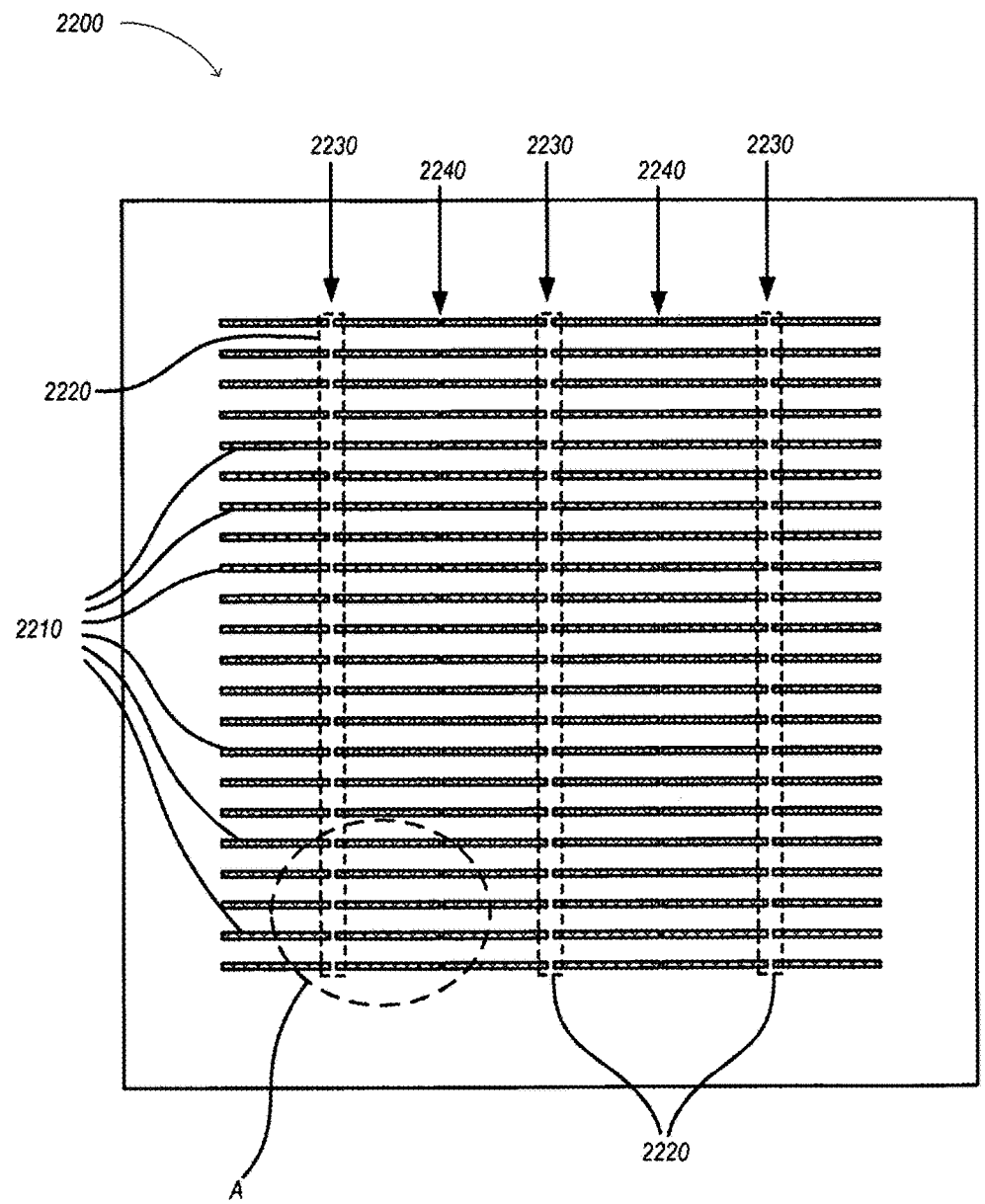
FIG. 22A schematically shows a screen for printing finger structures onto solar cells in a first screen printing step.

FIG. 22A schematically shows a screen 2200 for printing finger structures onto solar cells in a first screen printing step. Screen 2200 is an electroformed foil that is formed, e.g., using method 2300 described below. Screen 2200 includes openings 2210 in locations that correspond to the finger structures of the solar cells. Openings 2210 are not shown to scale; in particular, openings 2210 are shown in greater width than they would typically have in proportion to an overall size of screen 2200, for clarity of illustration. FIG. 22A also shows locations 2220 in dashed outline, where buss bars will be formed on the solar cells in a second screen printing step. Openings 2210 cross screen 2200 except at support bars 2230 and 2240, which occur in lines through screen 2200, noted by arrows in FIG. 22A (that is, each arrow points not just to a single occurrence of support bars 2230 or 2240 respectively, but to a line of such support bars occurring across screen 2200).

Figure 22B:
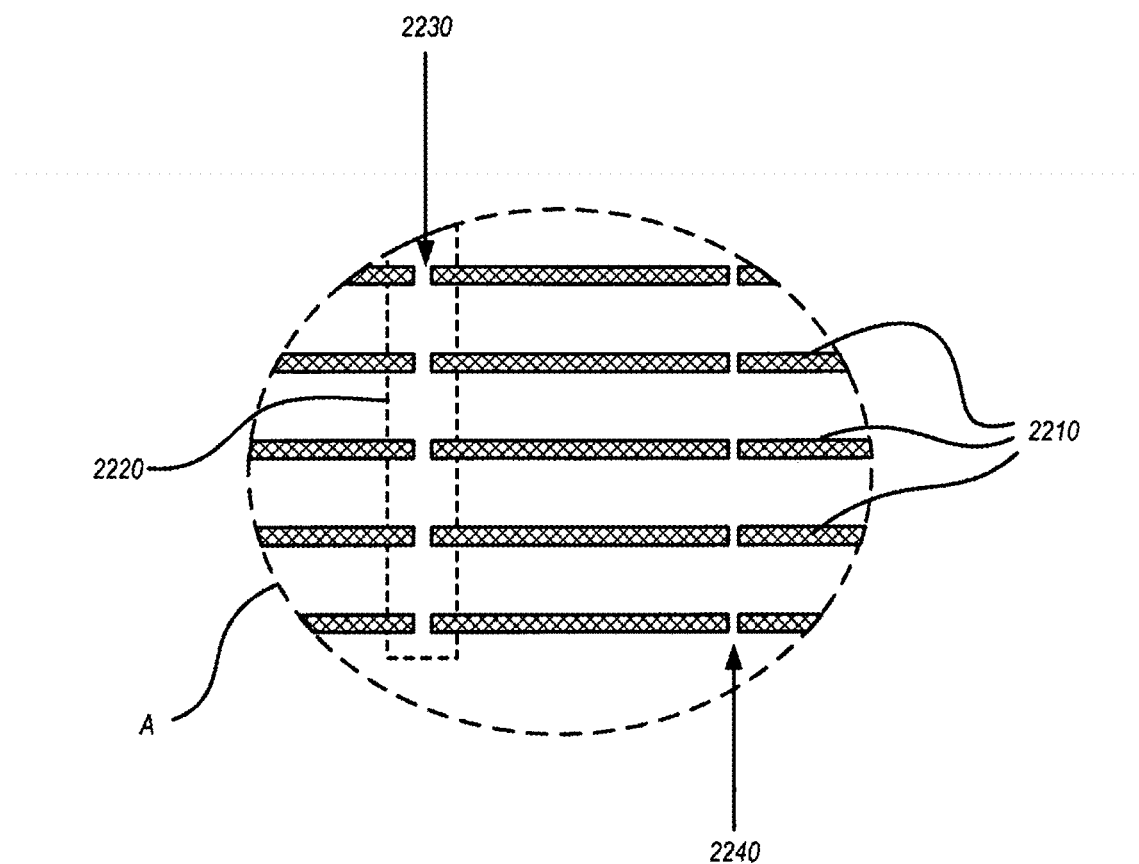
FIG. 22B is an enlarged schematic view of a region in FIG. 22A.

FIG. 22B is an enlarged schematic view of a region denoted as A in FIG. 22A. Openings 2210 are interrupted at support bars 2230 within locations 2220 that correspond to buss bars in the finished solar cells, as shown. Support bars 2230 allow metal of screen 2200 to traverse openings 2210, for improved structural integrity of screen 2200. Support bars 2230 may be of a width that is sufficient to increase structural integrity of screen 2200 but is also less than a width of locations 2220, so that once buss bars are printed over the finger structures, the buss bar material meets the finger electrode material printed on both sides of each support bar 2230. For example, support bars 2230 may be 100 to 300 mils wide, and especially about 170 mils wide.

Openings 2210 are also interrupted at support bars 2240 that are located halfway between locations 2220. Support bars 2240 also allow metal of screen 2200 to traverse openings 2210, for further improved structural integrity of screen 2200. Support bars 2240 may result in corresponding breaks in finger electrodes printed through openings 2210. However, when support bars 2240 are small and are halfway between locations 2220, the resulting solar cell performance does not degrade significantly, because charge carriers in this region can easily travel the small distance through the solar cell material to either nearby finger electrode section to a corresponding, adjacent buss bar. That is, the overall resistance penalty for the solar cell when gaps are present in the finger electrode material is low when such gaps are small (in comparison to the spacing between adjacent finger structures) and are equidistant from adjacent buss bars. Support bars 2240 may be approximately as narrow as a resolution limit of the photolithography process utilized to generate screen 2200, and may be approximately as wide as spacing between adjacent finger electrodes before the resistance penalty of the resulting solar cell starts to be significant. Therefore support bars 2240 may be approximately 5 to 200 mils wide, and most likely about 10 to 20 mils wide.

When screen 2200 is utilized for printing finger electrodes, it may be advantageous to utilize the mandrel side of the screen during electroforming, as the contact side of the screen during printing. This is because the electroformed openings are typically narrowest at the mandrel during electroforming, as seen in FIGS. 3A-3C and FIG. 4. The sharp mandrel side edge in screens thus formed helps keep printed finger traces tall and narrow, resulting in high conductivity with minimal light blockage of the solar cell material. The same advantages do not necessarily apply to a screen that prints buss bars, which are generally much wider than the finger electrodes and thus well above the minimum printing resolution supported by screen 2200. An electroformed screen that prints the buss bars may therefore utilize a mandrel side of the screen as a squeegee side of the screen during printing. Also, screen 2200 is one embodiment that includes both support bars 2230 and 2240, across the buss bar locations and equidistant from buss bar locations respectively; it is contemplated that other embodiments may include support bars only across the buss bar locations, or only equidistant from the buss bar locations.

Figure 23A:
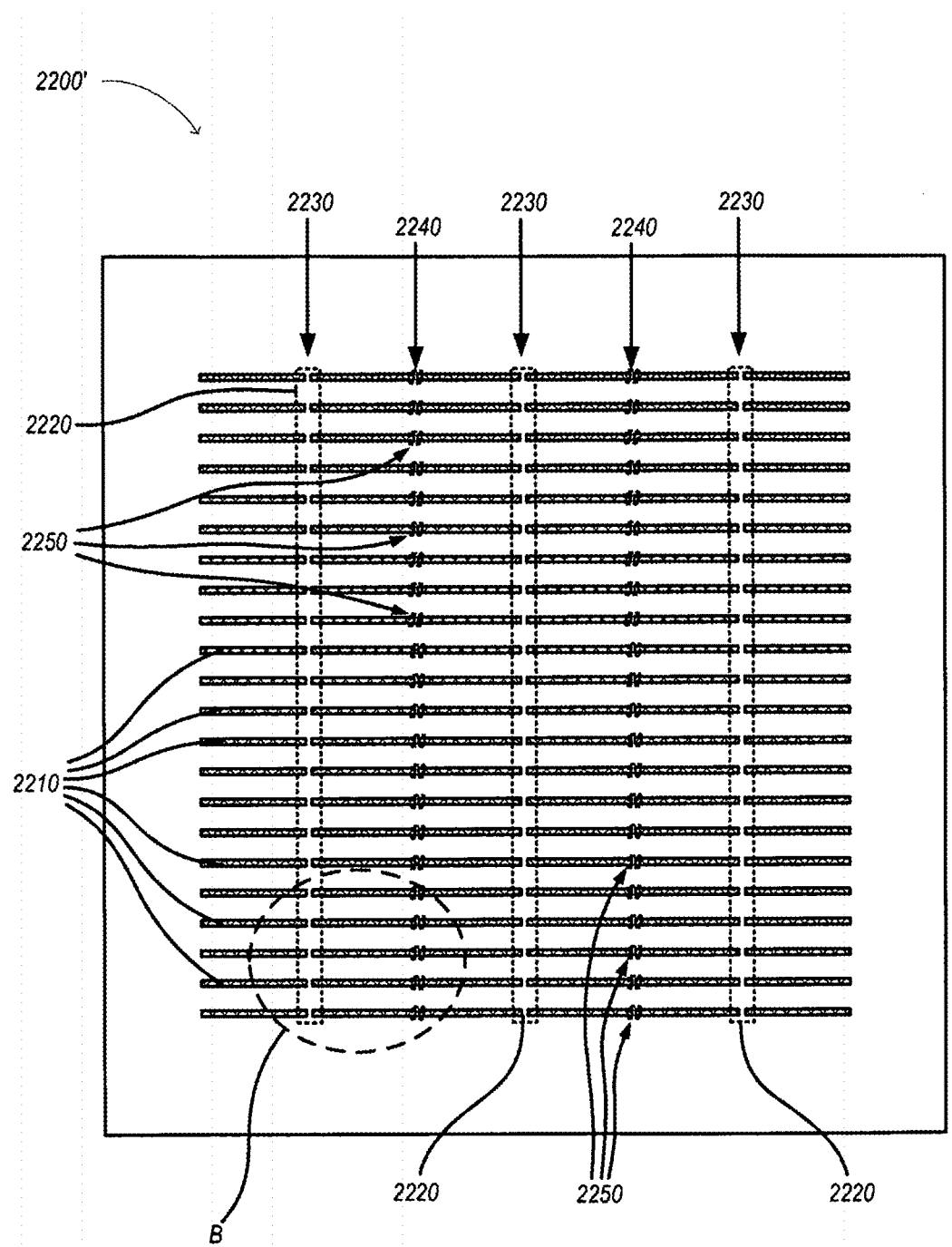
FIG. 23A schematically shows a screen for printing finger structures onto solar cells in a first screen printing step.
Figure 23B:
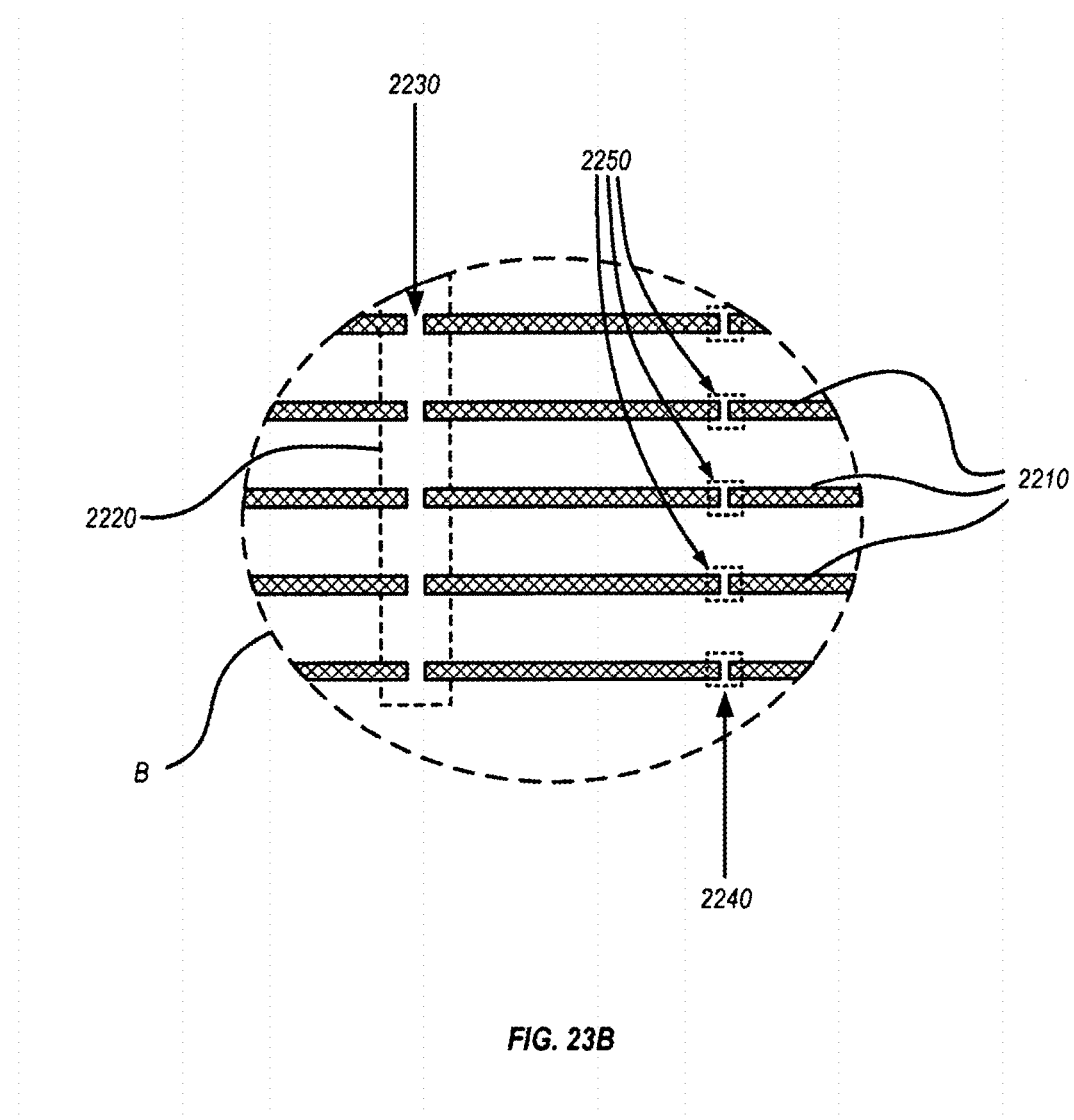
FIG. 23B is an enlarged schematic view of a region in FIG. 23A.

FIG. 23A schematically shows a screen 2200' for printing finger structures onto solar cells in a first screen printing step, and FIG. 23B is an enlarged schematic view of a region denoted as B in FIG. 22A. Screen 2200' is an electroformed foil that is formed, e.g., using method 2300 described below. The features of screen 2200' are identical to those of screen 2200 (FIG. 22), however FIG. 23A additionally shows locations 2250 where the buss bar screen is configured to print conductive paste to connect finger electrodes printed through openings 2210. Only representative locations 2250 are labeled within FIGS. 23A and 23B, for clarity of illustration. Locations 2250 may be designed into the buss bar screen and subsequently printed when a resistance penalty for breaks due to support bars 2240 is determined to be too high. Locations 2250 are shown slightly oversized in FIGS. 23A and 23B relative to the breaks due to support bars 2240, to allow for looser screen printing feature sizes and alignment tolerance that are expected to apply in the case of the buss bar screen. Printing locations 2250 using the buss bar screen imposes the requirement for aligning locations 2250 with the breaks due to support bars 2240, but opens up the possibility that support bars could be provided at more locations than being equidistant between buss bars, for increased mechanical integrity of screen 2200'.

Figure 24:
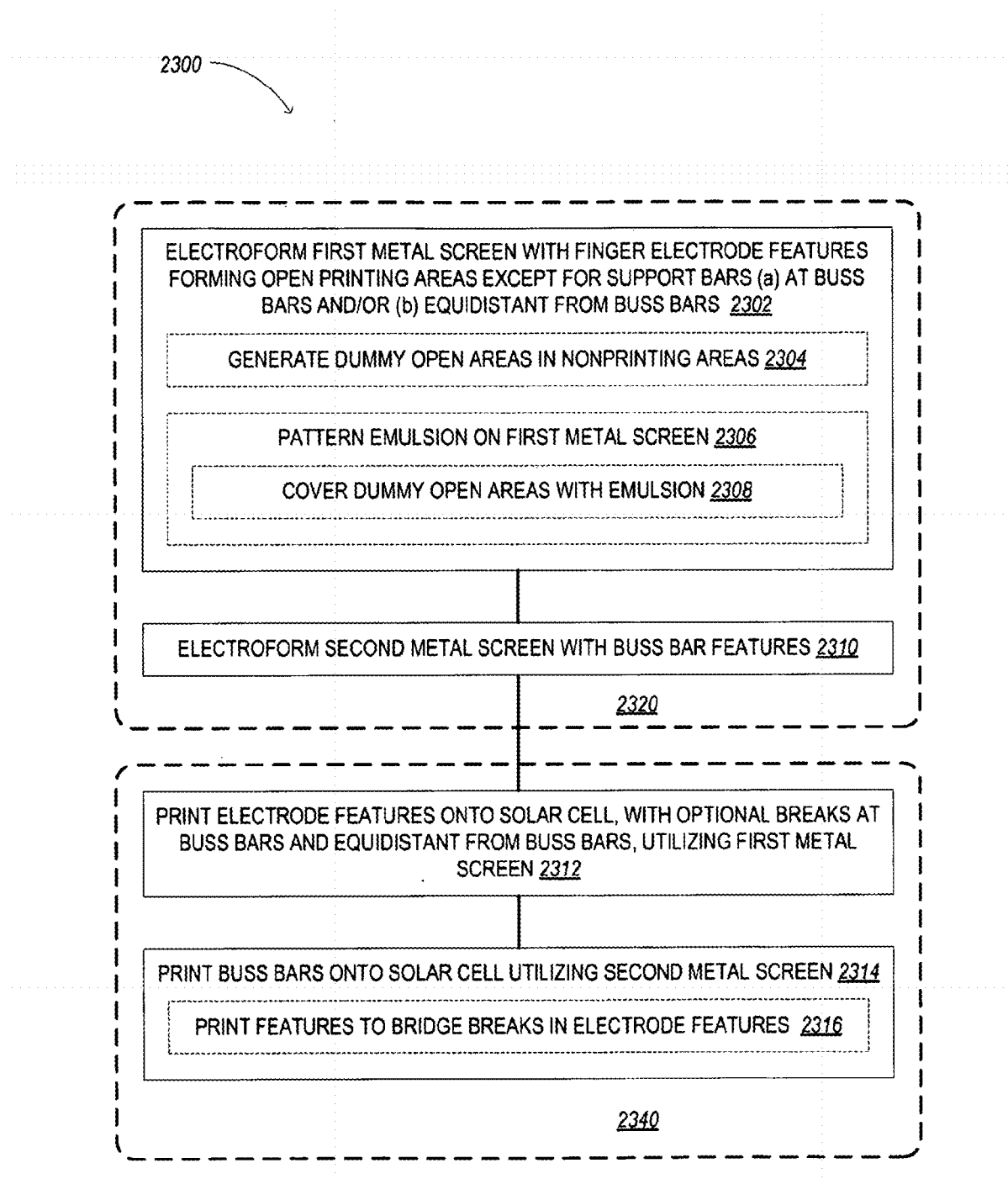
FIG. 24 is a flowchart of a method for generating screens and for screen printing electrodes connected by buss bars onto solar cells, in an embodiment.

FIG. 24 is a flowchart of a method 2300 for generating screens and for screen printing electrodes connected by buss bars onto solar cells. Method 2300 prints finger electrodes separately from buss bars so that features of the screens, and the printing processes utilizing the screens, can be separately optimized, as discussed below. In a first step 2302, a first metal screen is electroformed as described above, with finger electrode features that are open (e.g., are not crossed by the electroformed screen) except for support bars at two types of locations. The first type of location, denoted as (a) is where buss bars will eventually be printed. Since buss bars will be printed over these areas, breaks in the finger electrodes can be tolerated because the buss bar material will contact the finger electrode material on both sides of the breaks. Large support bars can therefore be formed across the open finger electrode areas of the first metal screen in these areas; such large support bars may be for example 100 to 300 mils wide, and especially about 170 mils wide. The second type of location, denoted as (b) is where the finger electrodes are equidistant from the buss bars. For lowest possible resistance, it is most desirable to print the finger electrodes across these areas, so small support bars (e.g., 5 to 200 mils wide, especially about 10 to 20 mils wide) can be placed across the finger electrodes. Since electrons generated by the solar cell can travel to either adjacent buss bar, there is a negligible resistance penalty for breaking a finger electrode at these points. Therefore, in embodiments, even relatively large support bars can be placed across the finger electrodes at these points.

Step 2302 may be optimized to produce the first metal screen that is optimized for the finest possible printing, to achieve small finger electrode size. Small finger electrode size is advantageous in that it preserves the maximum area in a solar cell that can actually interact with light to produce electrical power. For example, a photoresist utilized to mask deposition of metal may be optimized to produce small features, and an overall thickness of metal that is electroplated to form the screen may be tailored for screen printing of the small features. Step 2302 of method 2300 may also include optional steps 2304, 2306, 2308 described further below.

Step 2310 of method 2300 electroforms a second metal screen with buss bar features. The second screen may vary significantly from the first screen formed in step 2302. For example, the buss bars are much coarser features than the fine finger electrodes, so the printing step that utilizes the second screen may benefit from the second screen being thicker than the first screen.

Step 2312 prints finger electrode features onto a solar cell utilizing the first screen. The finger electrodes may or may not break at the locations of the support bars corresponding to buss bar locations and equidistant from the buss bars. Step 2312 is optimized for printing fine features to reduce the area of the solar cell in which the finger electrodes block light from reaching the solar cell material. For example, step 2312 may be performed by utilizing the mandrel side of the screen during electroforming, as the contact side of the screen during printing.

Step 2314 prints buss bars onto the solar cell. Step 2312 is optimized for printing coarser features than step 2312. Since the buss bars print at the locations where support bars were placed across the printing area of the finger electrodes, the buss bars connect across any breaks that were formed at that time. As noted above, breaks that form across the finger electrode printing areas equidistant from the buss bars may have inconsequential effect on resistance of the finished solar cell. An optional step 2316 prints features to bridge breaks in the electrode features caused by support bars. Step 2316 occurs at the same time as step 2314 and simply results when the buss bar screen includes open spaces at the locations of the support bar breaks in the electrode features. An example of step 2316 is utilizing a buss bar screen that includes open spaces at locations 2250, FIGS. 23A and 23B.

In embodiments, steps 2302 and 2310 form a screen generation subprocess 2320 of method 2300, and steps 2312 and 2314 form a solar cell printing subprocess 2340 of method 2300, as shown in FIG. 24. That is, subprocess 2320 of generating screens forms one embodiment herein, while subprocess 2340 of utilizing such screens to print solar cells forms a second embodiment.

Figure 25:
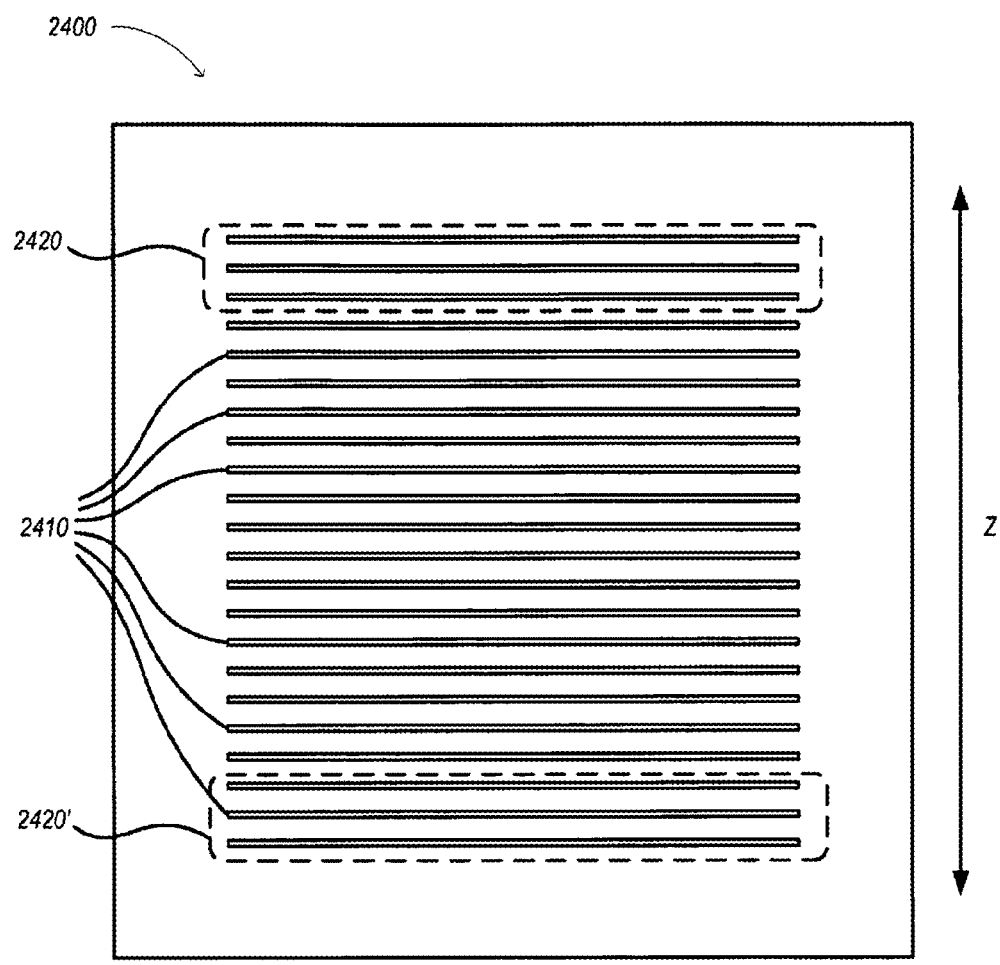
FIG. 25 schematically illustrates a screen that is under tension for printing, in an embodiment.

It has been discovered that metal screens can deform when stretched for printing, with deformation usually most notable in areas of the screen that are closest to the edges of the screen in the direction of tension. FIG. 25 schematically illustrates a screen 2400 that is under tension in a direction denoted as Z for printing. Screen 2400 includes open shapes 2410 intended, for example, to print finger electrodes. Areas indicated as 2420, 2420' schematically show where screen deformation might be expected; however, actual areas of deformation in a given screen will depend on various factors such as the screen tension in direction Z, where open shapes are located on the screen, thickness of the screen and other factors. In particular, deformation is often found in the nearest open shapes to the edge of the screen, likely because solid metal areas resist deformation better than the open areas.

Figure 26:
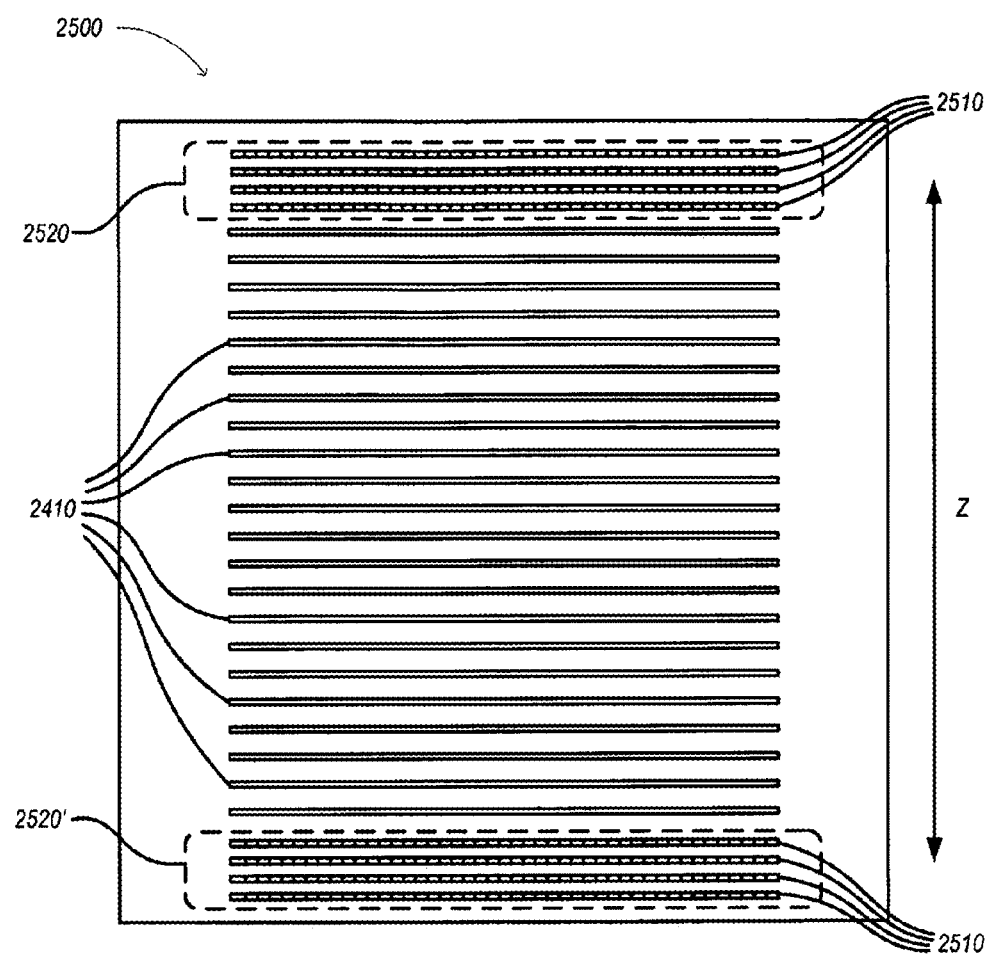
FIG. 26 shows a screen that is similar to the screen of FIG. 25, but includes features designed to reduce deformation in printing areas of the screen, in an embodiment.

FIG. 26 shows a screen 2500 that is similar to screen 2400, but includes features designed to reduce deformation in printing areas of the screen. Like screen 2400, screen 2500 includes open shapes 2410. Screen 2500 also includes dummy shapes 2510 that are similar in size and orientation to shapes 2410, but are located closer to edges of screen 2500 in direction Z. Because shapes 2510 are closer to edges of screen 2500 in direction Z than shapes 2410, deformation of screen 2500 under tension will be concentrated in the area of shapes 2510 so that shapes 2410 are not deformed. Areas 2520, 2520' are patterned with emulsion such that shapes 2510 do not print on a solar cell that is printed using screen 2500. It is appreciated that emulsion may already be patterned on screen 2500 for other reasons (e.g., to increase standoff distance of screen 2500 to a solar cell during printing, to promote transfer of a thick paste layer to a solar cell during printing). Thus, simply adding dummy shapes 2510 to the pattern utilized to form screen 2500, and ensuring that areas 2520, 2520' are patterned with emulsion on screen 2500, mitigates deformation of shapes 24W under tension.

Referring back to FIG. 24, optional steps 2304 through 2306 create screen 2500 shown in FIG. 26. Step 2304 generates dummy open areas (for example, shapes 2510) in a nonprinting area of screen 2500, simultaneously with generation of features that are intended to print (for example, shapes 2410). Step 2306 patterns emulsion on the screen; as discussed previously, emulsion may also be patterned for other reasons as well, such as to increase standoff distance of the screen during printing). When step 2306 is performed, step 2308 can simultaneously cover the dummy open areas with the emulsion.

Having described several embodiments, it will be recognized by those skilled in the art that various modifications, alternative constructions and equivalents may be used without departing from the spirit of the disclosure, for example, variations in sequence of steps and configuration, etc. Additionally, a number of well known mathematical derivations and expressions, processes and elements have not been described in order to avoid unnecessarily obscuring the present disclosure. Accordingly, the above description should not be taken as limiting the scope of the disclosure.

It should thus be noted that the matter contained in the above description or shown in the accompanying drawings should be interpreted as illustrative and not in a limiting sense. The following claims are intended to cover generic and specific features described herein, as well as all statements of the scope of the present method and system.

What is claimed is:

1. A method of forming screens for printing electrodes onto a solar cell, comprising:
    electroforming a first metal screen defining (a) first apertures oriented along a widthwise dimension of the first metal screen and configured to accept a first conductive paste to print finger electrodes onto the solar cell, and (b) at each of the first apertures one or more first support bars crossing the first aperture in a lengthwise dimension of the first metal screen; and
    electroforming a second metal screen defining one or more second apertures configured to accept a second conductive paste to print one or more buss bars onto the solar cell such that the buss bars cover gaps between the finger electrodes caused by the first support bars.

2. The method of claim 1, further comprising patterning emulsion on the first metal screen so that the emulsion does not cover the first apertures.

3. The method of claim 1, the step of electroforming the first metal screen comprising:
    forming a plurality of the first support bars for each first aperture; and
    forming, equidistantly between pairs of adjacent first support bars crossing each first aperture, a second support bar crossing the first aperture in the lengthwise dimension.

4. The method of claim 1, the step of electroforming the first metal screen further comprising:
    forming dummy apertures in nonprinting areas of the first metal screen, the nonprinting areas being closer to edges of the first metal screen than the first apertures in a direction of tension of the screen; and
    covering the dummy open areas with an emulsion.

5. The method of claim 1, further comprising:
    printing the finger electrodes onto the solar cell utilizing the first metal screen and the first conductive paste; and
    printing the buss bars onto the solar cell utilizing the second metal screen and the second conductive paste.

6. The method of claim 5, the second conductive paste being of different type than the first conductive paste.

7. The method of claim 5, further comprising:
    in the step of electroforming the first metal screen, forming the first metal screen on a mandrel with a mandrel side of the first metal screen facing the mandrel;
    removing the first metal screen from the mandrel; and in the step of printing the finger electrodes, contacting the mandrel side of the first metal screen to the solar cell.

8. The method of claim 1, the step of electroforming a second metal screen comprising defining the second apertures to (i) be oriented along a lengthwise dimension of the second metal screen and (ii) have greater width in a widthwise dimension of the second metal screen than width of the support bars in the widthwise dimension of the first metal screen.

9. A method of screen printing electrodes onto a solar cell, comprising:

printing finger electrodes onto the solar cell utilizing a first metal screen having first apertures defined therein for printing of the finger electrodes through the first apertures, each first aperture being oriented along a widthwise dimension of the first metal screen and being interrupted by (a) two or more large support bars crossing the first aperture, and (b) equidistantly between each pair of adjacent large support bars crossing each first aperture, one small support bar crossing the first aperture; and printing buss bars onto the solar cell utilizing a second metal screen having second apertures defined therein for printing of the buss bars through the second apertures, the buss bars covering gaps between the finger electrodes caused by the large support bars.

10. The method of claim 9, the second metal screen further defining third apertures, the step of printing the buss bars further comprising printing conductive paste, through the third apertures, at one or more locations associated with gaps in the finger electrodes caused by the small support bars.

11. The method of claim 9, the step of printing finger electrodes comprising printing conductive paste through the first apertures.

\* \* \* \* \*